(12) United States Patent
Okumura et al.

(10) Patent No.: US 7,922,862 B2
(45) Date of Patent: Apr. 12, 2011

(54) PLASMA PROCESSING APPARATUS, ELECTRODE PLATE FOR PLASMA PROCESSING APPARATUS, AND ELECTRODE PLATE MANUFACTURING METHOD

(75) Inventors: Katsuya Okumura, Tokyo (JP); Shinji Himori, Nirasaki (JP); Kazuya Nagaseki, Nirasaki (JP); Hiroki Matsumaru, Nirasaki (JP); Shoichiro Matsuyama, Nirasaki (JP); Toshiki Takahashi, Esashi (JP)

(73) Assignees: Octec Inc., Tokyo (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/505,940

(22) Filed: Jul. 20, 2009

(65) Prior Publication Data
US 2009/0285998 A1 Nov. 19, 2009

Related U.S. Application Data

(60) Division of application No. 11/195,803, filed on Aug. 3, 2005, now Pat. No. 7,585,386, which is a continuation of application No. PCT/JP2004/001042, filed on Feb. 3, 2004.

(30) Foreign Application Priority Data

Feb. 3, 2003 (JP) ................. 2003-025899
May 12, 2003 (JP) ................. 2003-132810
Feb. 2, 2004 (JP) ................. 2004-025007

(51) Int. Cl.
*H01L 21/00* (2006.01)
*C23C 14/00* (2006.01)
*C23C 16/00* (2006.01)

(52) U.S. Cl. .......... 156/345.28; 156/345.44; 118/723 R; 118/723 E

(58) Field of Classification Search ............. 156/345.47, 156/345.28, 345.44; 118/723 E, 723 R
See application file for complete search history.

(56) References Cited

U.S. PATENT DOCUMENTS

| | | | |
|---|---|---|---|
| 6,189,483 B1 | 2/2001 | Ishikawa et al. | |
| 6,228,438 B1 * | 5/2001 | Schmitt | 427/569 |
| 7,537,672 B1 * | 5/2009 | Koshiishi et al. | 156/345.47 |
| 2001/0023742 A1 | 9/2001 | Schmitt | |
| 2001/0036465 A1 | 11/2001 | Ishll et al. | |
| 2002/0036373 A1 | 3/2002 | Kosakai | |
| 2002/0134511 A1 | 9/2002 | Ushioda et al. | |
| 2002/0139478 A1 | 10/2002 | Ma et al. | |
| 2002/0187647 A1 | 12/2002 | Dhindsa et al. | |
| 2003/0155078 A1 * | 8/2003 | Ogasawara et al. | 156/345.47 |
| 2004/0083975 A1 * | 5/2004 | Tong et al. | 118/728 |

FOREIGN PATENT DOCUMENTS

JP 64-004481 1/1989

(Continued)

*Primary Examiner* — Ram N. Kackar
(74) *Attorney, Agent, or Firm* — Oblon, Spivak, McClelland, Maier & Neustadt, L.L.P.

(57) ABSTRACT

A plasma processing apparatus for performing a plasma process on a target substrate includes a process container configured to accommodate the target substrate and to reduce pressure therein. A first electrode is disposed within the process container. A supply system is configured to supply a process gas into the process container. An electric field formation system is configured to form an RF electric field within the process container so as to generate plasma of the process gas. A number of protrusions are discretely disposed on a main surface of the first electrode and protrude toward a space where the plasma is generated.

18 Claims, 30 Drawing Sheets

| | FOREIGN PATENT DOCUMENTS | |
|---|---|---|
| JP | 3-54825 | 3/1991 |
| JP | 4-36482 | 2/1992 |
| JP | 7-18438 | 1/1995 |
| JP | 09-022798 | 1/1997 |
| JP | 09-312268 | 12/1997 |
| JP | 11-176919 | 7/1999 |
| JP | 2000-323456 | 11/2000 |
| JP | 2001-148368 | 5/2001 |
| JP | 2002-60953 | 2/2002 |
| JP | 2002-246368 | 8/2002 |
| JP | 2002246368 A * | 8/2002 |
| JP | 2003-249400 | 9/2003 |
| JP | 2003-282542 | 10/2003 |
| JP | 2004-95664 | 3/2004 |
| JP | 2004-221571 | 8/2004 |
| WO | WO 02/03427 | 1/2002 |
| WO | WO 02/065820 | 8/2002 |

* cited by examiner

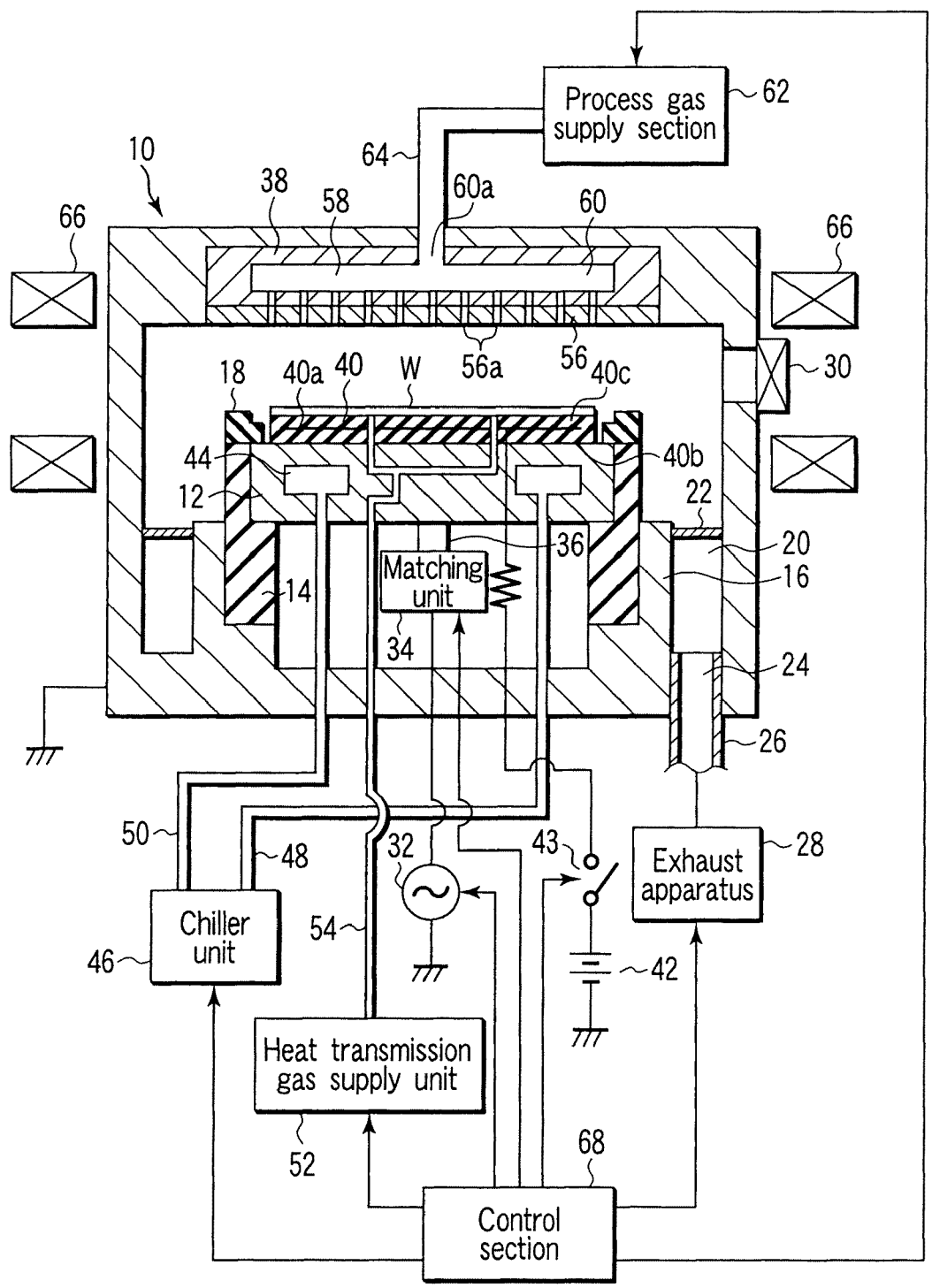
F I G. 1

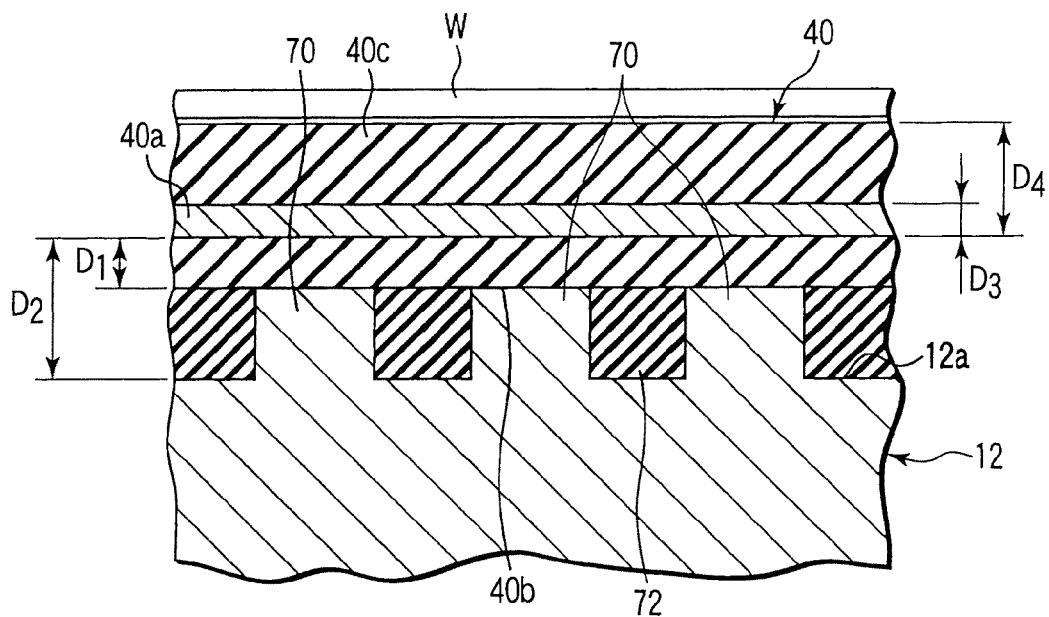
F I G. 10
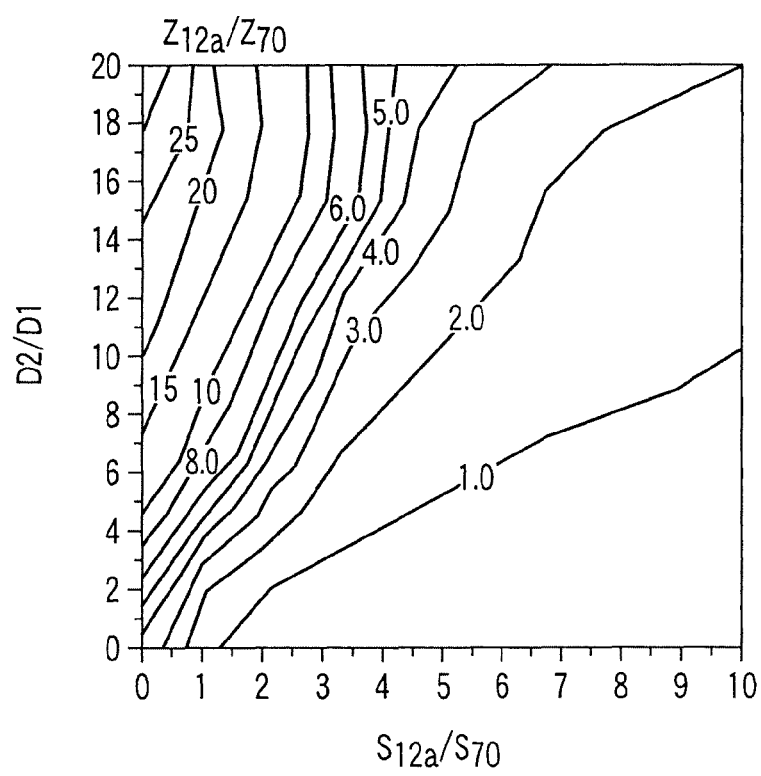
F I G. 11

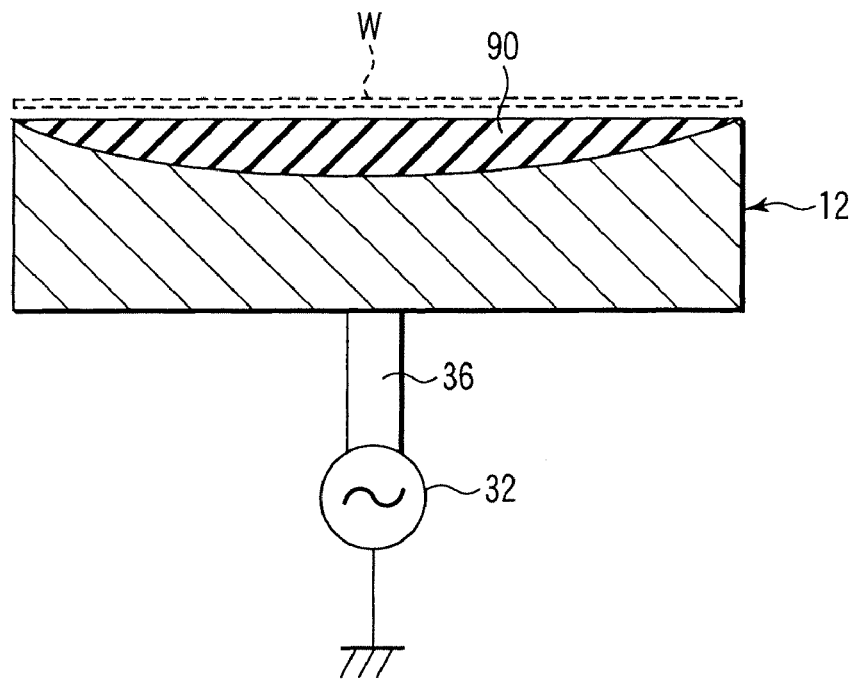
F I G. 19
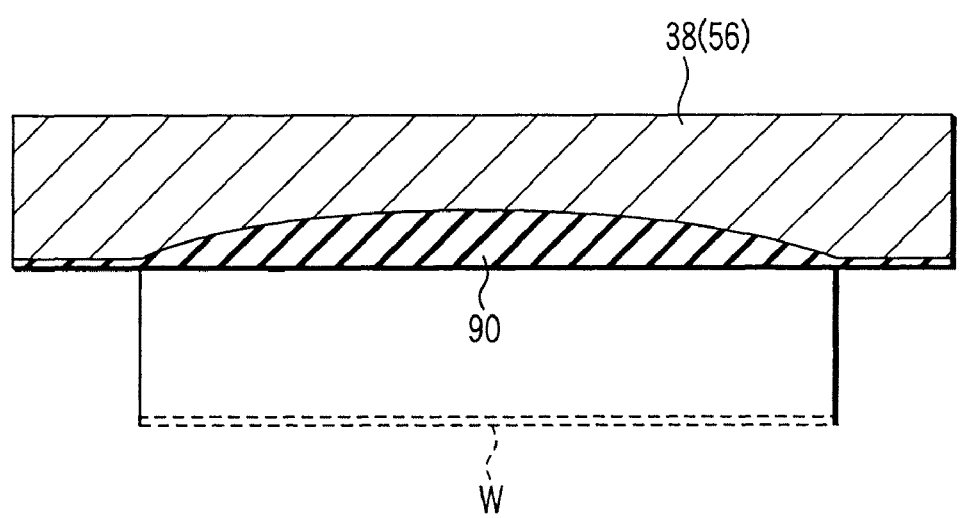
F I G. 20

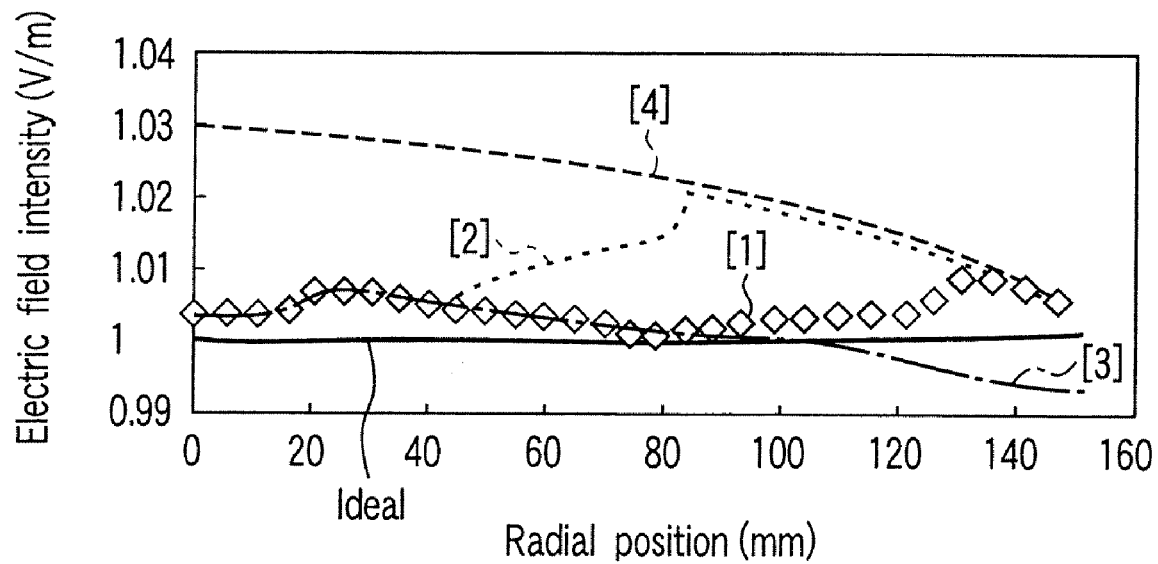
F I G. 24A
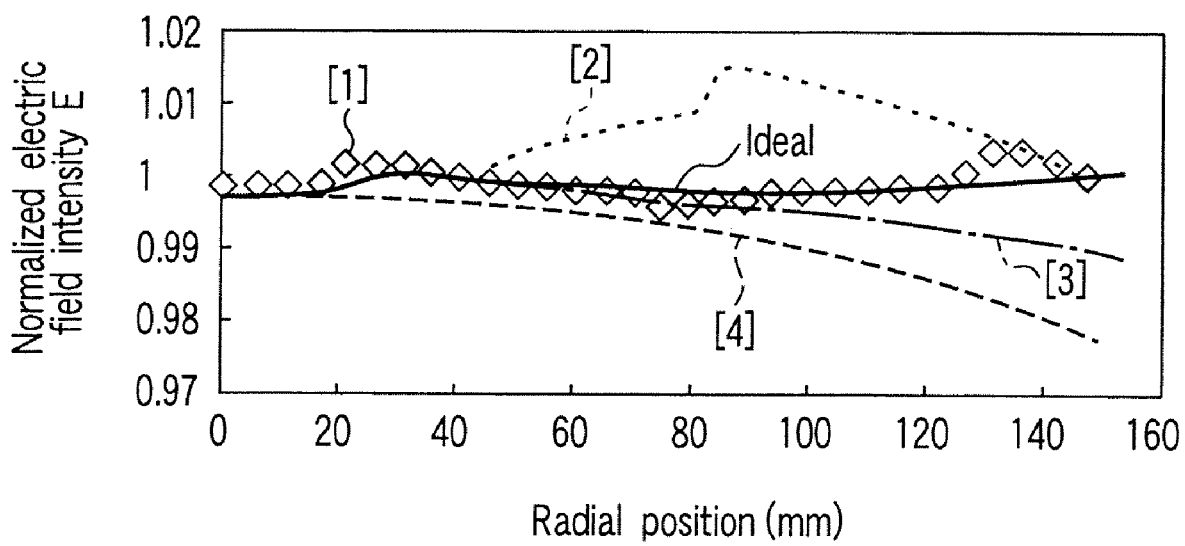
F I G. 24B

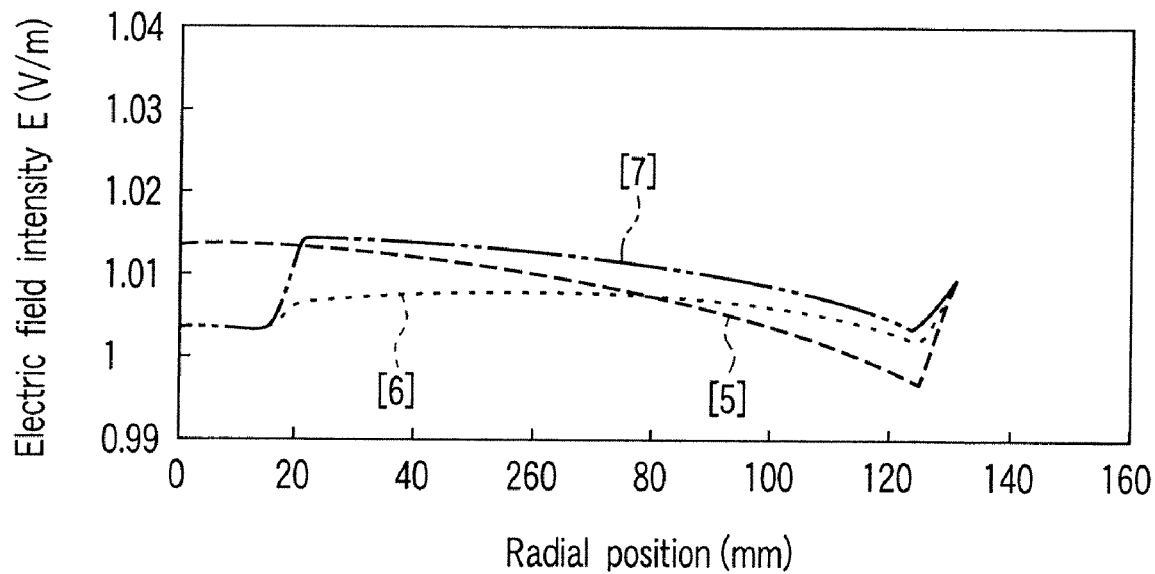
F I G. 26A
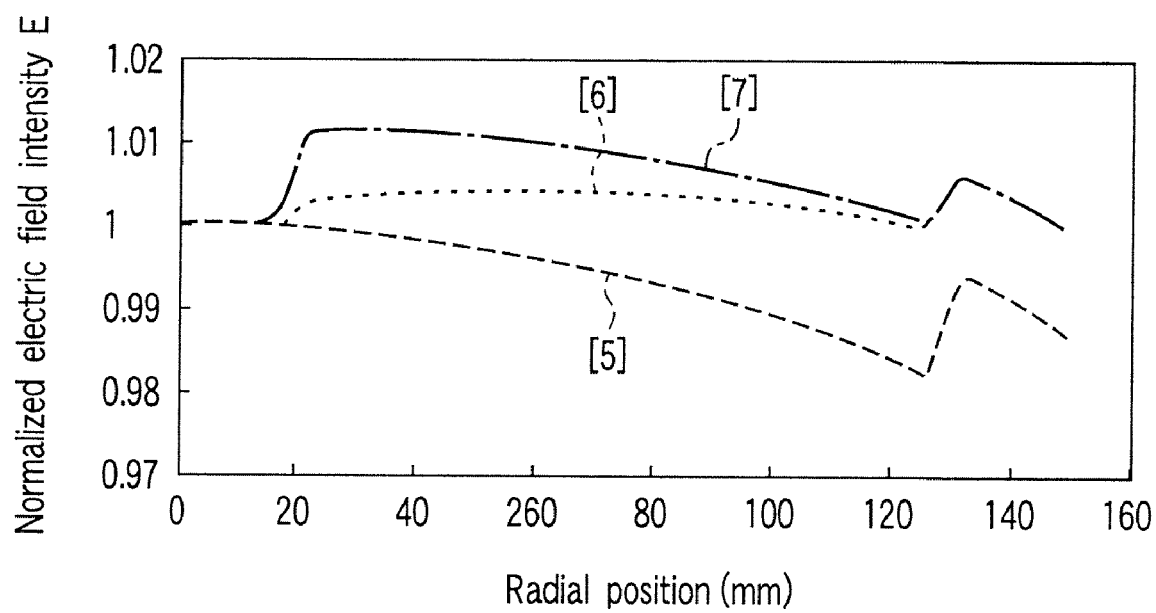
F I G. 26B

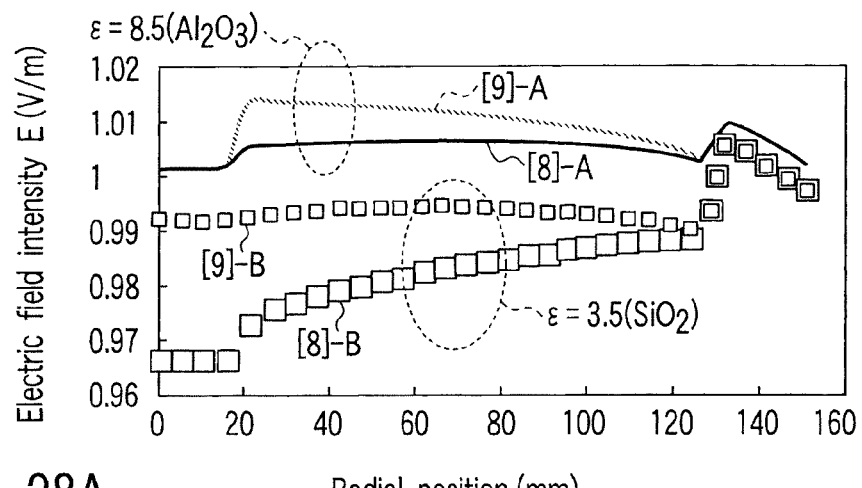
F I G. 28A
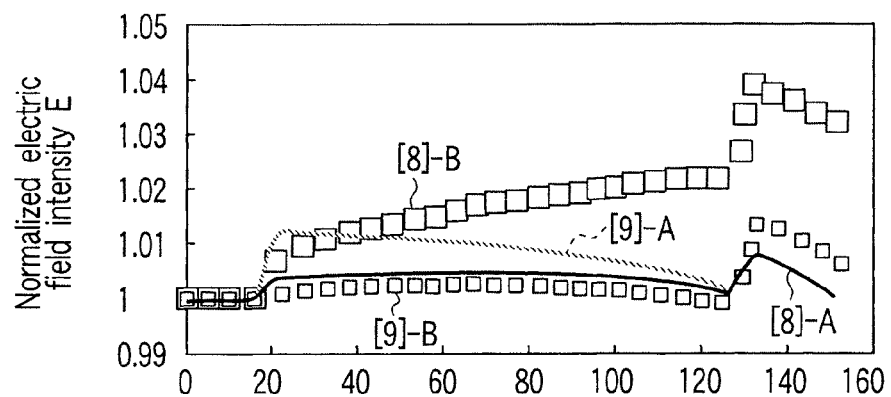
F I G. 28B
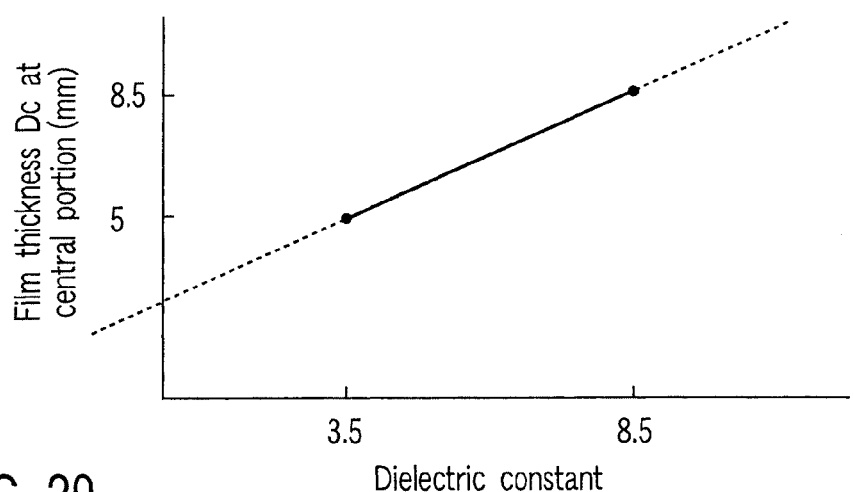
F I G. 29

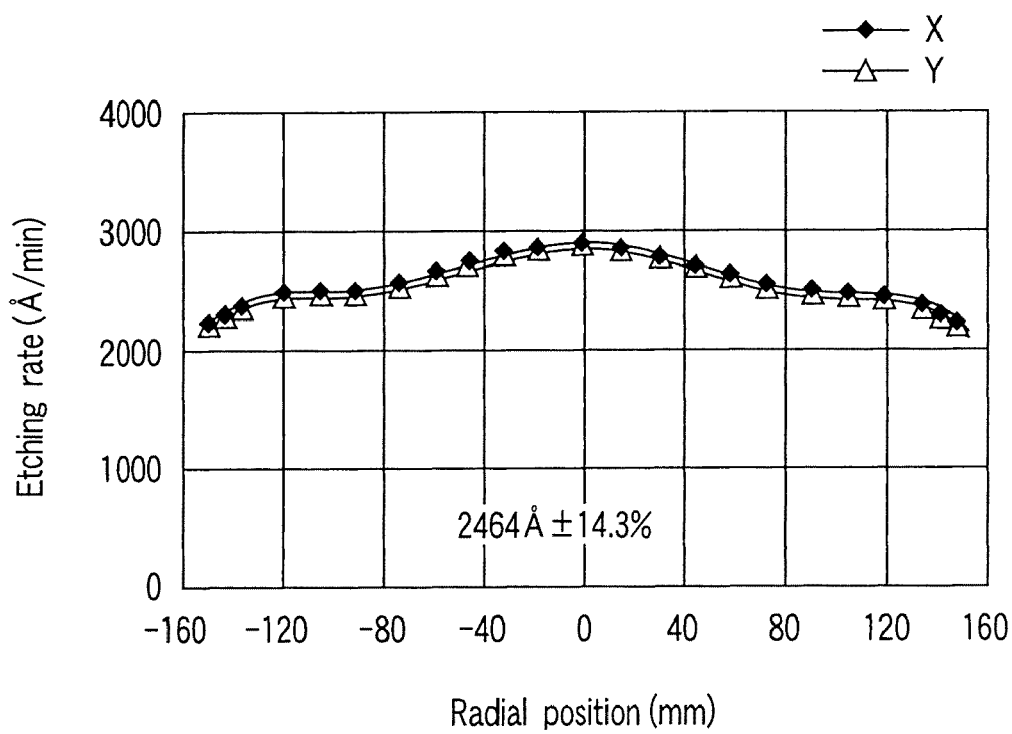
F I G. 30A
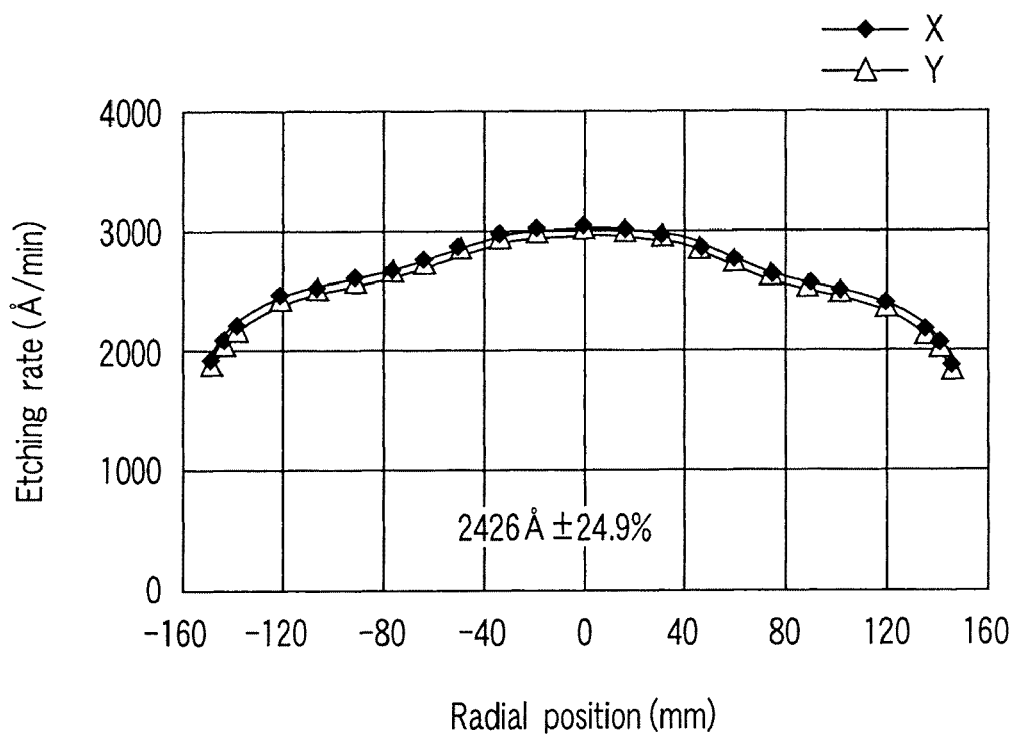
F I G. 30B

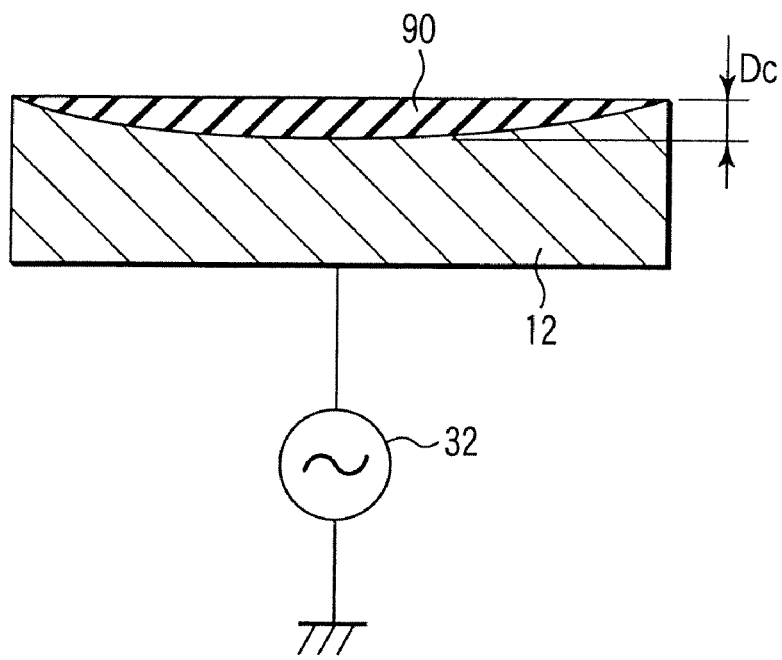
F I G. 31A
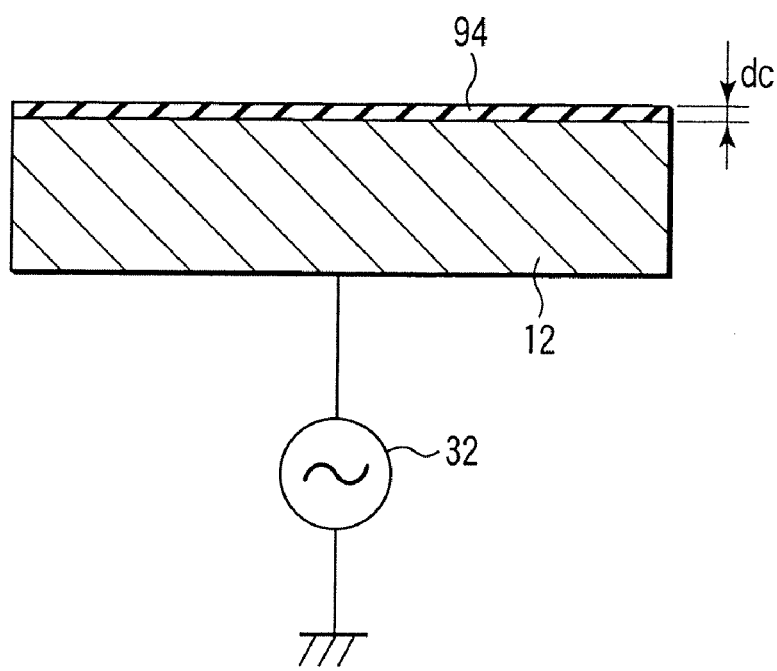
F I G. 31B

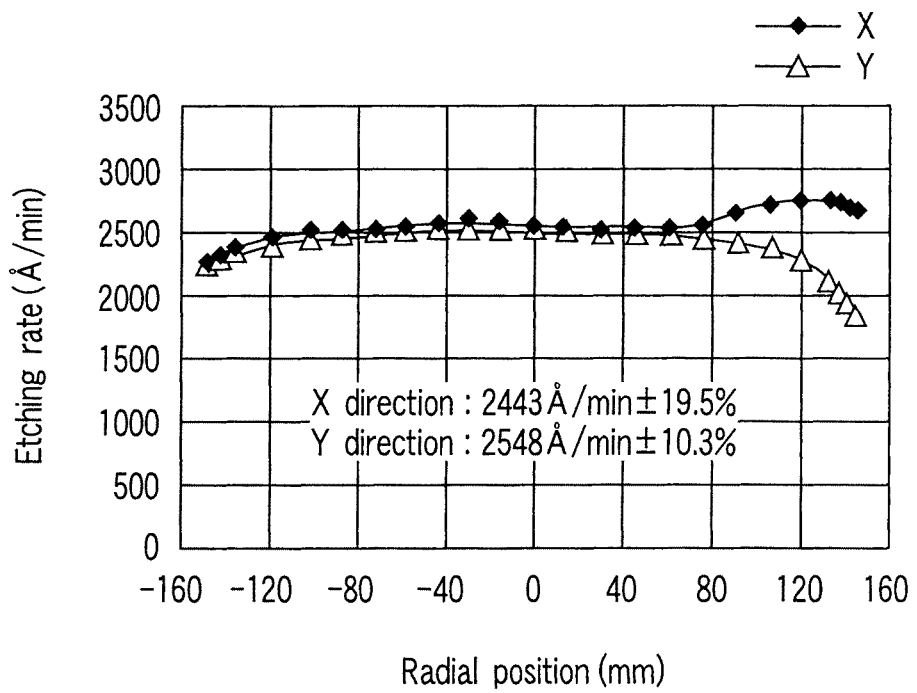
F I G. 32A
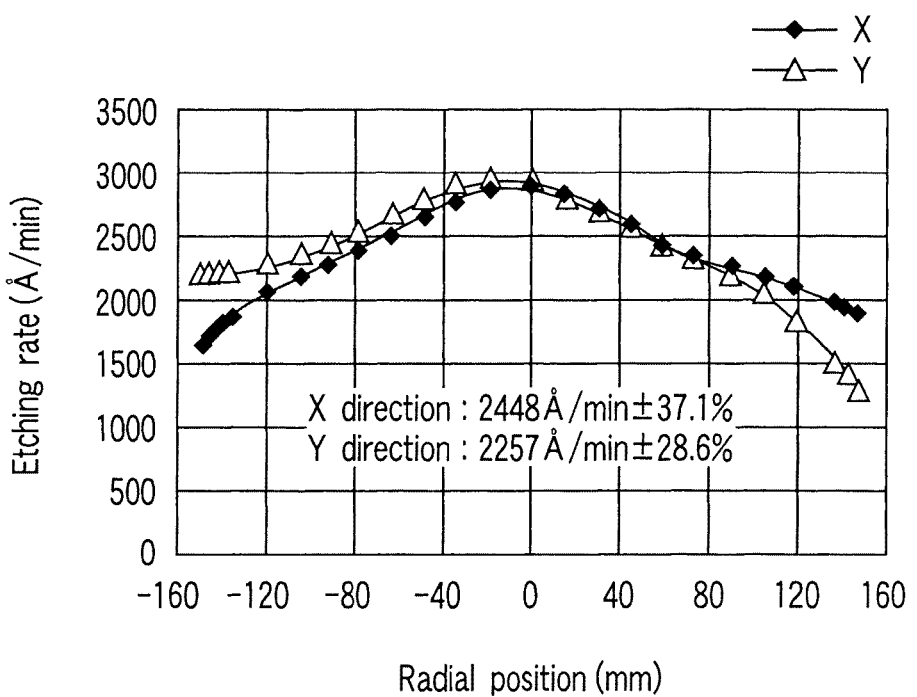
F I G. 32B

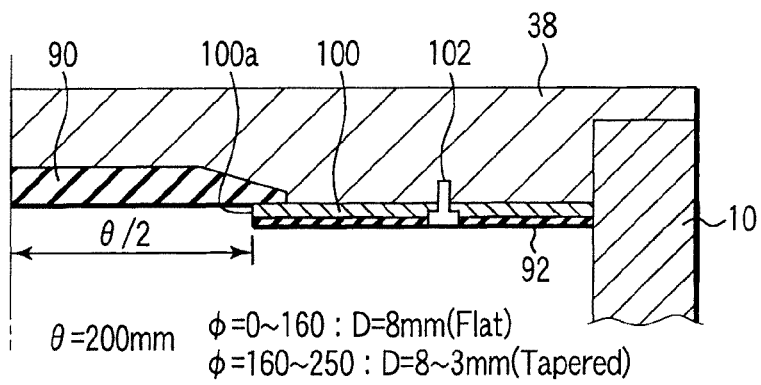
F I G. 33A
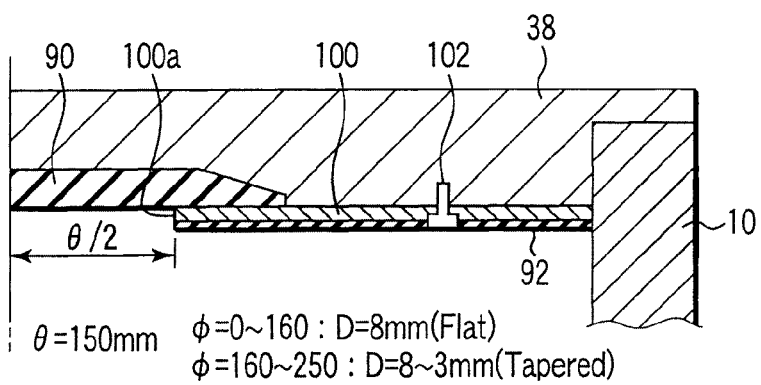
F I G. 33B
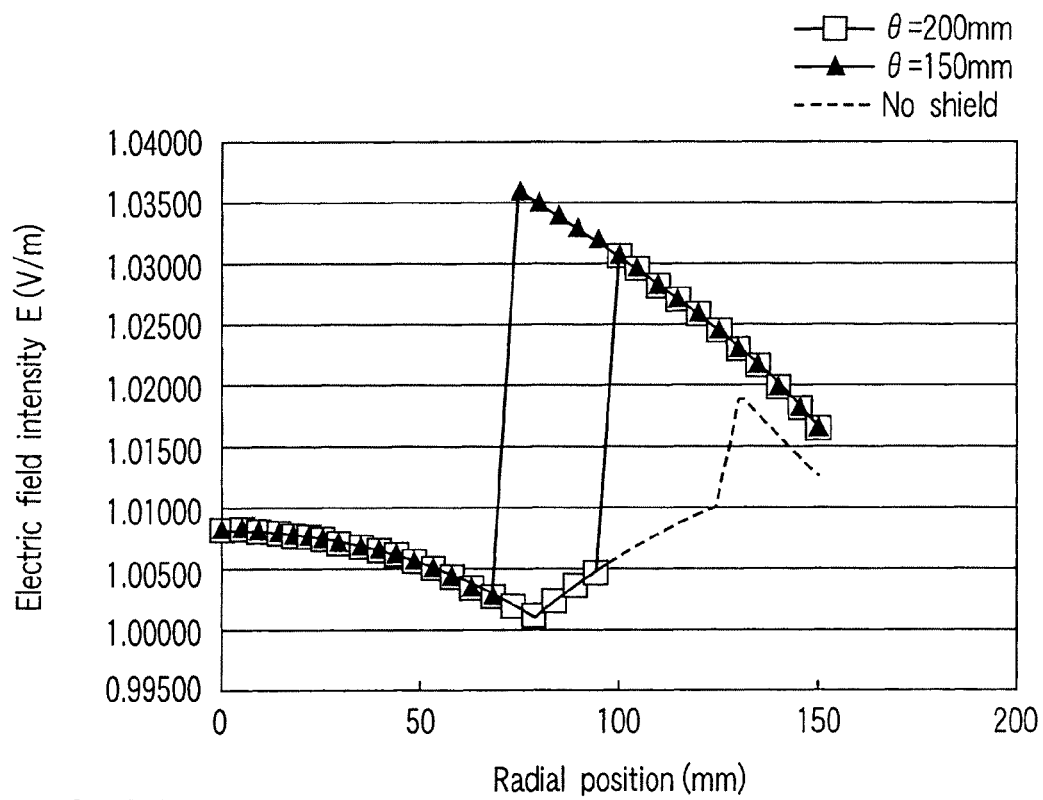
F I G. 34

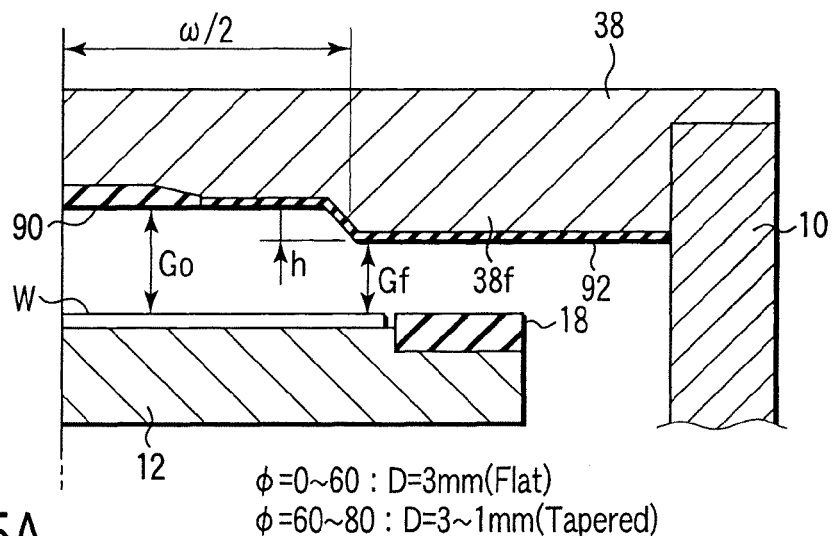
F I G. 35A
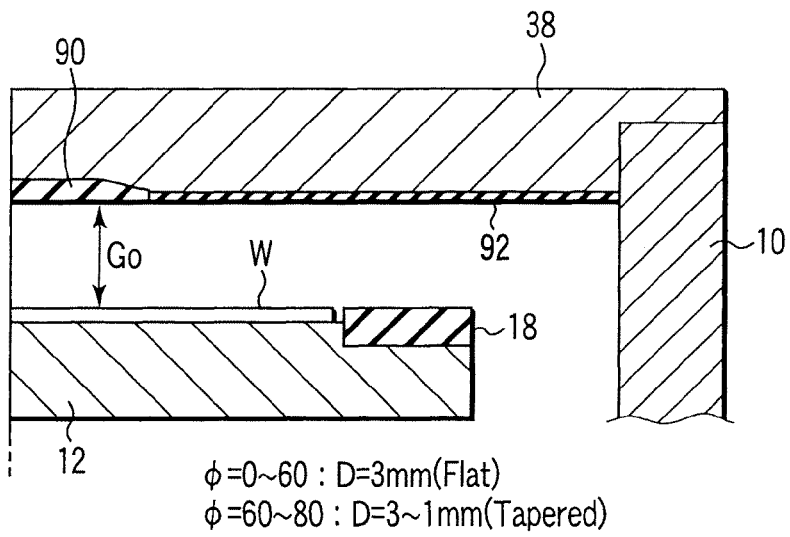
F I G. 35B
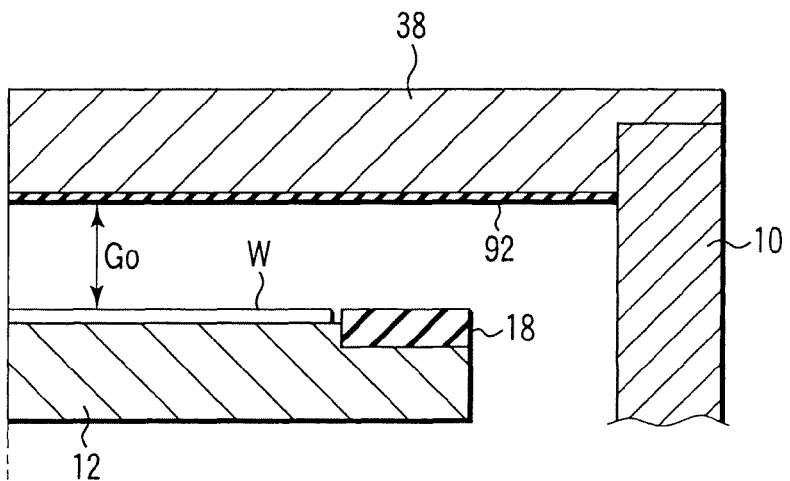
F I G. 35C

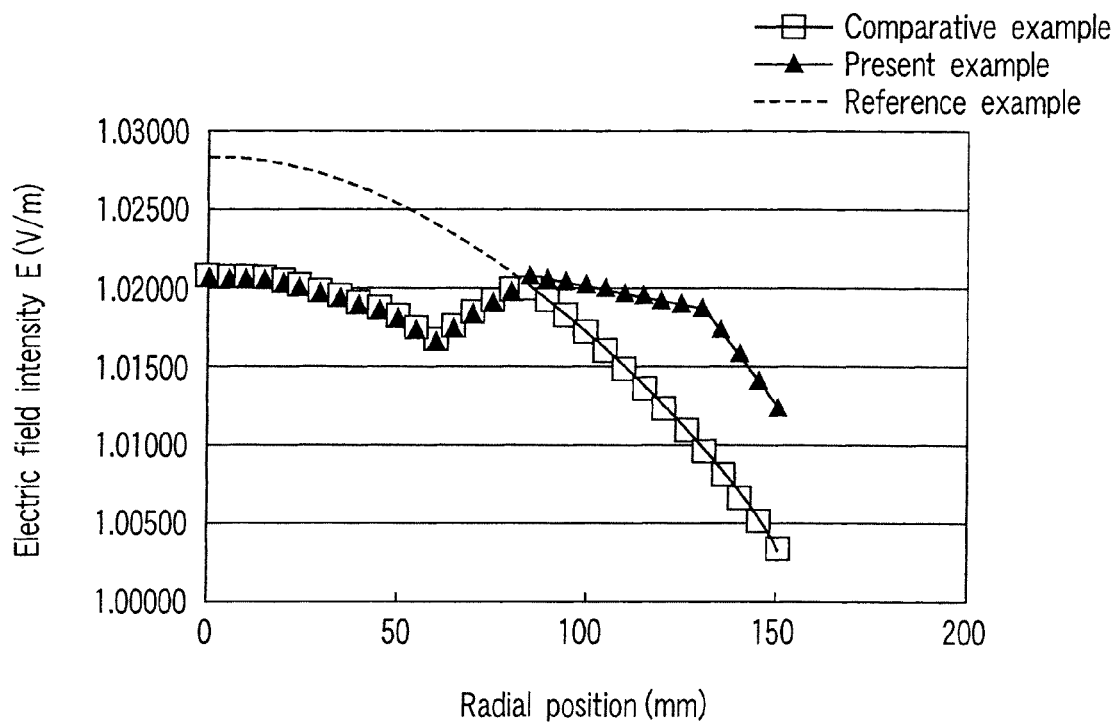
F I G. 36
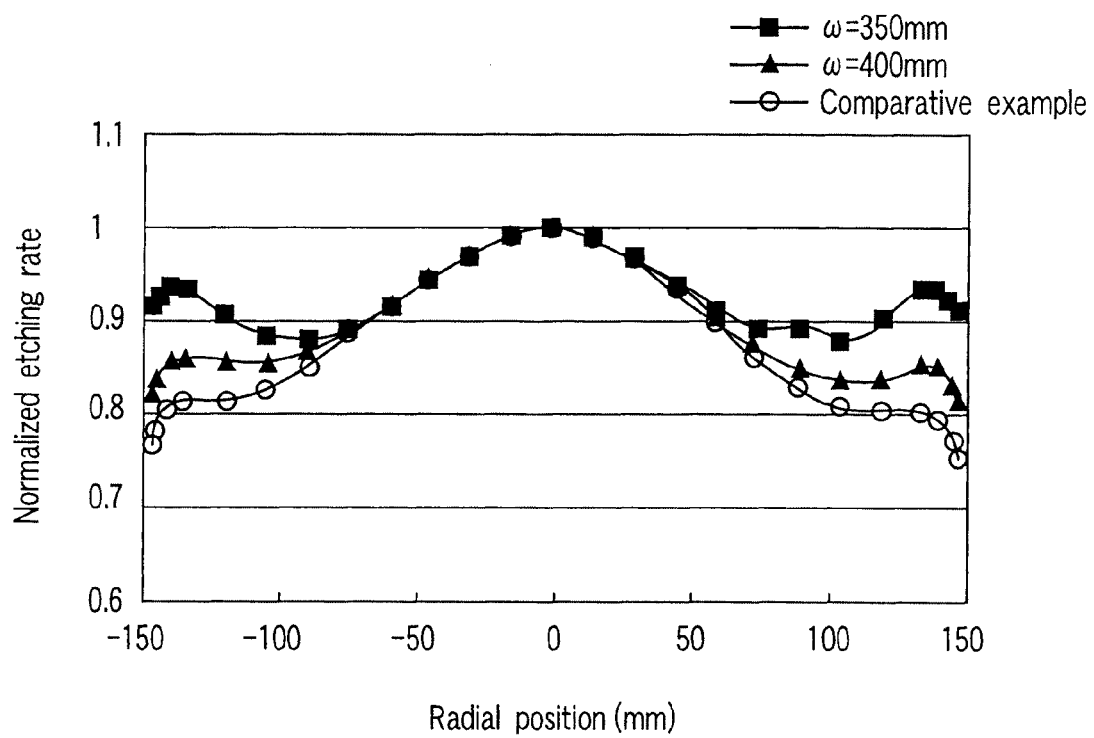
F I G. 38

PLASMA PROCESSING APPARATUS, ELECTRODE PLATE FOR PLASMA PROCESSING APPARATUS, AND ELECTRODE PLATE MANUFACTURING METHOD

CROSS-REFERENCE TO RELATED APPLICATIONS

The present application is a division of application Ser. No. 11/195,803, filed on Aug. 3, 2005, which is a Continuation Application of PCT Application No. PCT/JP2004/001042, filed Feb. 3, 2004, which was published under PCT Article 21(2) in Japanese and claims the benefit of priority from prior Japanese Patent Applications No. 2003-025899, filed Feb. 3, 2003; No. 2003-132810, filed May 12, 2003; and No. 2004-025007, filed Feb. 2, 2004, the entire contents of all of which are incorporated herein by reference.

BACKGROUND OF THE INVENTION

1. Field of the Invention

The present invention relates to a technique for subjecting a target substrate to a plasma process, and specifically to a plasma processing technique of the RF (radio frequency) discharge type that applies an RF to an electrode to generate plasma. Particularly, the present invention relates to a plasma processing technique utilized in a semiconductor process for manufacturing semiconductor devices. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices and FPDs, plasma is often used for processes, such as etching, deposition, oxidation, and sputtering, so that process gases can react well at a relatively low temperature. In general, plasma processing apparatuses are roughly classified, in terms of the plasma generation type, into those utilizing glow discharge or RF discharge, and those utilizing microwave.

In general, a plasma processing apparatus of the RF discharge type includes a process container or reaction chamber, and an upper electrode and a lower electrode disposed therein in parallel with each other. The lower electrode is configured to support a target substrate (semiconductor wafer, glass substrate, or the like) thereon. The upper electrode or lower electrode is supplied with RF voltage for plasma generation through a matching unit. Electrons are accelerated by an RF electric field formed by the RF voltage and collide with a process gas, thereby ionizing the gas and generating plasma.

In recent years, miniaturization proceeds in the design rules used for manufacturing processes, and thus plasma processes are required to generate higher density plasma at a lower pressure. Under the circumstances, there is a trend in plasma processing apparatuses of the RF discharge type described above, such that the RF applied is selected from a range covering far higher frequencies (for example, 50 MHz or more) than conventional values (typically, 27 MHz or less). However, if the frequency of the RF discharge is set higher, when the RF power is applied from an RF power supply through a feed rod to the electrode backside, it is transmitted through the electrode surface by means of the skin effect and flows from the edge portion to the central portion on the electrode main surface (the surface facing the plasma). If an RF current flows from the edge portion to the central portion on the flat electrode main surface, the electric field intensity at the central portion of the electrode main surface becomes higher than the electric field intensity at the edge portion, so the density of generated plasma becomes higher at the electrode central portion than at the electrode edge portion. Further, the resistivity of plasma becomes lower at the electrode central portion having a higher plasma density, and, also on the counter electrode, an electric current concentrates at the central portion, so the uniformity of the plasma density is further lowered.

In order to solve this problem, a design is known in which the main surface central portion of an RF electrode is formed of a high resistivity member (for example, Jpn. Pat. Appln. KOKAI Publication No. 2000-323456). According to this technique, the high resistivity member is employed for the central portion of the main surface (plasma contact surface) of an electrode connected to an RF power supply. The high resistivity member consumes more RF power as Joule heat there, so that the electric field intensity on the electrode main surface is more reduced at the electrode central portion than at the electrode peripheral portion. As a consequence, the low uniformity described above in plasma density is remedied.

However, in plasma processing apparatuses of the RF discharge type described above, the high resistivity member employed for the main surface central portion of an RF electrode may consume too much RF power as Joule heat (energy loss).

BRIEF SUMMARY OF THE INVENTION

In consideration of problems of conventional techniques, an object of the present invention is to provide a plasma processing apparatus of the RF discharge type and an electrode plate for a plasma processing apparatus, which can efficiently improve the plasma density uniformity.

Another object of the present invention is to provide an electrode plate manufacturing method for efficiently fabricating a structure of an electrode plate for a plasma processing apparatus according to the present invention provided with an electrostatic chuck integrally disposed thereon.

In order to achieve the objects described above, according to a first aspect of the present invention, there is provided a plasma processing apparatus comprising a process container configured to reduce pressure therein and a first electrode disposed within the process container, such that an RF electric field is formed within the process container and a process gas is supplied thereinto to generate plasma of the process gas, thereby performing a required plasma process on a target substrate by the plasma, wherein a number of protrusions are discretely disposed on a main surface of the first electrode and protrude toward a space where the plasma is generated. According to this apparatus structure, an RF for plasma generation may be applied to the first electrode, or to another electrode, such as a second electrode of the parallel-plate type facing the first electrode. Where the RF is applied to the first electrode, the RF may be applied from a backside of the first electrode reverse to the main surface.

Where the RF is applied from a backside of the first electrode, when an RF current flows on the main surface of the first electrode by means of the skin effect from the electrode edge portion to the electrode central portion, it flows through the surface layer of the protrusions. Since the protrusions protrude toward the plasma space, they are electrically coupled with the plasma with a lower impedance, as compared with the portion other than the protrusions or the bottom portion on the main surface. Accordingly, the RF power carried by the RF current flowing through the surface layer on the main surface of the electrode is discharged mainly from the top surface of the protrusions toward the plasma. In this case, each of a number of protrusions discretely disposed on the main surface of the first electrode functions as a small electrode to apply an RF power to the plasma. By suitably selecting properties (shape, size, distance, density, and so forth) of the protrusions, the RF power application characteristic of the first electrode relative to plasma can be controlled as required.

For example, in order to ensure the RF power application function described above of the protrusions, the protrusions on the main surface of the first electrode may preferably have a height and a width in an electrode radial direction, each of which is three times or more a skin depth δ defined by the following formula (1), $$\delta = (2/\omega\sigma\mu)^{1/2} \quad (1)$$

where ω=2 πf (f: frequency), σ: specific electric conductivity, and μ: magnetic permeability.

Further, in order to improve the uniformity of electric field intensity or plasma density in an electrode radial direction, the protrusions on the main surface of the first electrode may preferably have an area density that gradually increases from the electrode central portion to the electrode edge portion. For example, where the protrusions have a constant size, the protrusions may have a number density that gradually increases from the electrode central portion to the electrode edge portion.

In a preferable example, the protrusions may be formed of columns. Alternatively, the protrusions may be formed of rings, which are concentrically disposed as a whole.

Further, in order to improve the RF power discharge function described above of the protrusions, a dielectric body may be preferably disposed at least at a position other than the protrusions on the main surface of the first electrode.

According to a second aspect of the present invention, there is provided a plasma processing apparatus comprising a process container configured to reduce pressure therein and a first electrode disposed within the process container, such that an RF electric field is formed within the process container and a process gas is supplied thereinto to generate plasma of the process gas, thereby performing a required plasma process on a target substrate by the plasma, wherein a number of recesses are discretely disposed on a main surface of the first electrode and dent opposite a space where the plasma is generated. Also, according to this apparatus structure, an RF for plasma generation may be applied to the first electrode, or to another electrode, such as a second electrode of the parallel-plate type facing the first electrode. Where the RF is applied to the first electrode, the RF may be applied from a backside of the first electrode reverse to the main surface.

Since the recesses are dent opposite the plasma space, they are electrically coupled with the plasma with a higher impedance, as compared with the portion other than the recesses (the top portion of the electrode main surface). Accordingly, the RF power carried by an RF current flowing through the surface layer on the main surface of the first electrode is discharged mainly from the portion other than the recesses (the top portion of the electrode main surface) toward the plasma. In this case, each of a number of recesses discretely disposed on the main surface of the first electrode functions as an electrode mask portion to suppress application of an RF power to the plasma. By suitably selecting properties (shape, size, distance, density, and so forth) of the recesses, the effect of the first electrode concerning plasma generation can be controlled as required.

For example, in order to ensure the RF power application mask function described above of the recesses, the recesses on the main surface of the first electrode may preferably have a height and a width in an electrode radial direction, each of which is three times or more the skin depth δ described above.

Further, in order to improve the uniformity of electric field intensity or plasma density in an electrode radial direction, the recesses on the main surface of the first electrode may preferably have an area density that gradually decreases from the electrode central portion to the electrode edge portion. For example, where the recesses have a constant size, the recesses may have a number density that gradually decreases from the electrode central portion to the electrode edge portion.

In a preferable example, the recesses may be formed of columnar recesses. Further, in order to improve the RF power application mask function described above of the recesses, a dielectric body may be preferably disposed at least within the recess on the main surface of the first electrode.

According to a third aspect of the present invention, there is provided a plasma processing apparatus comprising a process container configured to reduce pressure therein and a first electrode disposed within the process container, such that an RF electric field is formed within the process container and a process gas is supplied thereinto to generate plasma of the process gas, thereby performing a required plasma process on a target substrate by the plasma, wherein a dielectric body is disposed on a main surface of the first electrode and has a thickness larger at an electrode central portion than at an electrode edge portion. Also, according to this apparatus structure, an RF for plasma generation may be applied to the first electrode, or to another electrode, such as a second electrode of the parallel-plate type facing the first electrode. Where the RF is applied to the first electrode, the RF may be applied from a backside of the first electrode reverse to the main surface.

In this electrode structure, since the electrode central portion has a higher impedance than the electrode edge portion, an RF electric field is formed such that the intensity is enhanced at the electrode edge portion while it is weakened at the electrode central portion. As a consequence, the uniformity of the electric field intensity or plasma density is improved.

In this structure, the dielectric body may preferably have a profile such that the thickness of the dielectric body gradually decreases (preferably in an arch-shape) from the electrode central portion to the electrode edge portion. Alternatively, the dielectric body may preferably have a thickness that is essentially constant inside a first diameter including the electrode central portion. In this case, the dielectric body may have a thickness that decreases taper-wise toward the electrode edge portion outside the first diameter, or the dielectric body may have a thickness that is essentially constant between the first diameter and a second diameter larger than the first diameter, and then decreases taper-wise toward the electrode edge portion outside the second diameter. The area size of the dielectric body can be arbitrarily set in accordance with the size of the target substrate, and may be typically set to be the same as the size of the target substrate. In other words, the edge portion of the dielectric body where the thickness takes on a minimum value may be located around a position facing the edge portion of the target substrate. Further, since there is a constant correlation between the dielectric constant of the dielectric body and the thickness of the dielectric body at the electrode central portion to provide a good planar uniformity, the dielectric body at the electrode central portion may have a thickness set in accordance with a dielectric constant of the dielectric body in use.

In a preferable example, a conductive shield member may be disposed to partly cover the dielectric body, e.g., near the edge portion, on the main surface of the first electrode. According to this structure, the effect of the dielectric body for reducing the electric field intensity is attenuated at the portion covered with the shield member. Accordingly, by adjusting the shape and/or size of the shield member, the distribution characteristic of electric field intensity can be adjusted. The shield member may be preferably detachable or replaceable.

In a preferable example, the main surface of the first electrode may be provided with an outer electrode portion protruding by a required protruding amount toward a space where the plasma is generated, the outer electrode portion being distant from an outer edge of the dielectric body by a required distance outward in the radial direction. In this electrode structure, the protrusion disposed outside the dielectric film in the radial direction allows the distribution characteristic of electric field intensity to be controlled or adjusted such that the electric field intensity becomes higher near the edge of the target substrate. This adjustment of the electric field intensity distribution by the protrusion can be controlled by the protruding amount of the protrusion or the position of the protrusion shoulder.

In another preferable example, the dielectric body on the main surface of the first electrode may have a portion protruding by a required protruding amount toward a space where the plasma is generated. In this electrode structure, the protrusion of the dielectric film allows the distribution characteristic of electric field intensity to be controlled or adjusted such that the electric field intensity becomes higher at respective position of the plasma generation space facing the dielectric body.

In another preferable example, the dielectric body on the main surface of the first electrode may have a void formed therein, which contains a dielectric fluid (preferably an organic solvent). In this structure, the dielectric constant or dielectric impedance of the entire dielectric body can be arbitrarily adjusted by suitably selecting or setting the amount of the dielectric fluid contained in the void or occupation space shape thereof. The void may be formed within a solid dielectric body. Alternatively, at least the front surface may be formed of a solid dielectric body on the main surface of the first electrode, while an inner wall or recess is defined by the electrode host material (conductor).

In the plasma processing apparatus according to the first, second, or third aspect, even where the first electrode provided with the protrusions, recesses, or dielectric body described above is designed to be supplied with no RF, such as where the first electrode is connected to the ground potential, it is possible to obtain the same effect as described above on the plasma generation space.

A plasma processing apparatus according to the present invention may include an electrostatic chuck for attracting and holding the target substrate by a Coulomb force. The electrostatic chuck may be disposed on the main surface of the first electrode to be supplied with an RF power supply, or may be disposed on the main surface of the counter electrode or second electrode. Where the electrostatic chuck is disposed on the main surface of the first electrode, the second electrode may be connected to the ground potential through the process container, so that an RF current in the plasma can flow to the ground through the process container.

According to the first aspect of the present invention, there is provided an electrode plate for a plasma processing apparatus, which is to be disposed within a process container for generating plasma in a plasma processing apparatus of an RF discharge type, the electrode plate comprising a number of protrusions discretely disposed on a main surface to face the plasma. According to this electrode plate, it is possible to obtain the same effect as the first or second electrode of a plasma processing apparatus according to the first aspect, as described above.

An electrode plate manufacturing method of the present invention for manufacturing the electrode plate according to the first aspect comprises: covering a main surface of an electrode substrate with a mask that has openings in accordance with the protrusions; applying a conductive metal or semiconductor by thermal spray onto the main surface of the electrode substrate from above the mask, thereby forming the protrusions in the openings; and removing the mask from the main surface of the electrode substrate.

According to the second aspect of the present invention, there is provided an electrode plate for a plasma processing apparatus, which is to be disposed within a process container for generating plasma in a plasma processing apparatus of an RF discharge type, the electrode plate comprising a number of recesses discretely disposed on a main surface to face the plasma. According to this electrode plate, it is possible to obtain the same effect as the first or second electrode of a plasma processing apparatus according to the second aspect, as described above.

An electrode plate manufacturing method of the present invention for manufacturing the electrode plate according to the second aspect comprises: covering a main surface of an electrode substrate with a mask that has openings in accordance with the recesses; applying a solid particles or liquid by blasting onto the main surface of the electrode substrate from above the mask, thereby physically removing portions of the electrode substrate in the openings so as to form the recesses; and removing the mask from the main surface of the electrode substrate.

The electrode plate manufacturing method of the present invention may preferably further comprise, after removing the mask, applying a dielectric body by thermal spray onto the main surface of the electrode substrate, thereby forming a first dielectric film. By doing so, a dielectric body for increasing the impedance ratio is formed on the portion other than the protrusions in the case of the electrode plate according to the first aspect, or formed within the recess in the case of the electrode plate according to the second aspect.

Further, in order to integrally dispose an electrostatic chuck on the electrode plate according to the first or second aspect, the method may preferably further comprise: forming the first dielectric film to have a thickness entirely covering the main surface of the electrode substrate; applying an electrode material by thermal spray onto the first dielectric film, thereby forming an electrode film of the electrostatic chuck; and then, applying a dielectric body by thermal spray onto the electrode film, thereby forming a second dielectric film. With this method, it is possible to simultaneously and integrally form a dielectric body for increasing the impedance ratio with the lower insulating film of the electrostatic chuck, on the main surface of the electrode plate according to the first or second aspect.

According to the third aspect of the present invention, there is provided an electrode plate for a plasma processing apparatus, which is to be disposed within a process container for generating plasma in a plasma processing apparatus of an RF discharge type, the electrode plate comprising a dielectric body on a main surface to face the plasma, which has a thickness larger at an electrode central portion than at an electrode edge portion. According to this electrode plate, it is possible to obtain the same effect as the first or second electrode of a plasma processing apparatus according to the third aspect, as described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional side view showing a plasma etching apparatus according to an embodiment of the present invention;

FIG. 10 is a sectional side view showing a structure in which an electrostatic chuck is integrally formed with a susceptor according to the first embodiment;

FIG. 11 is a view showing the impedance ratio characteristic between the protrusions and bottom portion in the susceptor structure with the electrostatic chuck shown in FIG. 10;

FIG. 19 is a plan view showing a lower electrode structure according to a third embodiment;

FIG. 20 is a plan view showing an upper electrode structure according to the third embodiment;

FIGS. 24A and 24B are views showing distribution characteristics of electric field intensity in the radial direction between electrodes, obtained by the present examples shown in FIGS. 23A to 23D and an ideal profile;

FIGS. 26A and 26B are views showing distribution characteristics of electric field intensity in the radial direction between electrodes, obtained by the present examples shown in FIGS. 25A to 25D;

FIGS. 28A and 28B are views showing distribution characteristics of electric field intensity in the radial direction between electrodes, obtained by the present examples shown in FIGS. 27A to 27C;

FIG. 29 is a view showing the correlation between the dielectric constant of a dielectric film and the film thickness at the electrode central portion, the dielectric film being designed to provide a practically sufficient planar uniformity in accordance with data points in FIGS. 28A and 28B;

FIGS. 30A and 30B are views showing distribution characteristics of organic film etching rate, obtained in a present example A of an upper electrode according to the third embodiment and a comparative example B, respectively, for comparison;

FIGS. 31A and 31B are views showing a present example of a lower electrode according to the third embodiment and a comparative example, respectively, for comparison;

FIGS. 32A and 32B are views showing distribution characteristics of organic film etching rate, obtained in the present example shown in FIG. 31A and the comparative example shown in FIG. 31B, respectively, for comparison;

FIGS. 33A and 33B are partial and sectional views showing present examples of an upper electrode structure according another embodiment of the present invention;

FIG. 34 is a view showing distribution characteristics of electric field intensity in the radial direction between electrodes, obtained by the present examples shown in FIGS. 33A and 33B;

FIGS. 35A to 35C are partial and sectional views showing a present example of an upper electrode structure according to another embodiment of the present invention, a comparative example, and a reference example, respectively;

FIG. 36 is a view showing distribution characteristics of electric field intensity in the radial direction between electrodes, obtained by the present example, comparative example, and reference example shown in FIGS. 35A to 35C;

FIG. 38 is a view showing distribution characteristics of oxide film etching rate (normalized value), obtained by the present examples and comparative example, shown in FIGS. 37A to 37C;

DETAILED DESCRIPTION OF THE INVENTION

Figure 2:
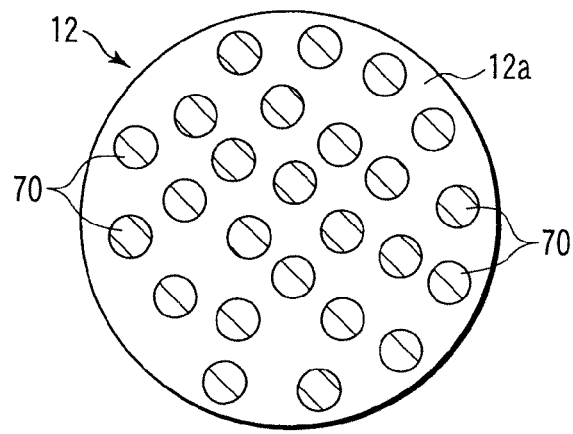
FIG. 2 is a plan view showing a susceptor structure according to the first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a sectional side view showing a plasma etching apparatus according to an embodiment of the present invention. This plasma etching apparatus is structured as a plasma etching apparatus of the RIE type. The plasma processing apparatus includes a cylindrical chamber (process container) 10 made of a metal, such as aluminum or stainless steel. The chamber 10 is protectively grounded.

The chamber 10 is provided with a lower electrode or susceptor 12 formed of a circular plate disposed therein, on which a target substrate or semiconductor wafer W is placed. The susceptor 12 is made of, e.g., aluminum, and is supported through an insulative cylindrical holder 14 on a cylindrical support portion 16, which extends vertically upward from the bottom of the chamber 10. A focus ring 18 made of, e.g., quartz is disposed on top of the cylindrical holder 14 to surround the top surface of the susceptor 12.

An exhaust passage 20 is defined between the sidewall of the chamber 10 and the cylindrical support portion 16. The exhaust passage 20 is provided with an annular baffle plate 22 attached at the entrance or middle, and an exhaust port 24 formed at the bottom. The exhaust port 24 is connected to an exhaust apparatus 28 through an exhaust line 26. The exhaust apparatus 28 includes a vacuum pump for reducing the pressure of the process space within the chamber 10 to a predetermined vacuum level. A transfer port for a semiconductor wafer W is formed in the sidewall of the chamber 10 and is opened/closed by a gate valve 30.

The susceptor 12 is electrically connected to a radio frequency (RF) power supply 32 for generating plasma, through a matching unit 34 and a power feeding rod 36. The RF power supply 32 is arranged to apply an RF power of a predetermined frequency, such as 60 MHz, to the susceptor 12 used as a lower electrode. A showerhead 38 described later is disposed on the ceiling of the chamber 10 and is used as an upper electrode at the ground potential. The RF voltage from the RF power supply 32 is capacitively applied across the space between the susceptor 12 and showerhead 38.

The susceptor 12 is provided with an electrostatic chuck 40 on the top, for holding the semiconductor wafer W by an electrostatic attraction force. The electrostatic chuck 40 comprises an electrode 40a made of a conductive film, and a pair of insulating films 40b and 40c sandwiching the electrode 40a. The electrode 40a is electrically connected to a direct-current (DC) power supply 42 through a switch 43. With a DC voltage applied from the DC power supply 42, the electrostatic chuck 40 attracts and holds the semiconductor wafer W on the chuck by a Coulomb force.

The susceptor 12 is further provided with a cooling medium space 44 formed therein and annularly extending therethrough. A cooling medium set at a predetermined temperature, such as cooling water, is circulated within the cooling medium space 44 from a chiller unit 46 through lines 48 and 50. The temperature of the cooling medium is set to control the process temperature of the semiconductor wafer W placed on the electrostatic chuck 40. Further, a heat transmission gas, such as He gas, is supplied from a heat transmission gas supply unit 52, through gas supply line 54, into the interstice between the top surface of the electrostatic chuck 40 and the backside of the semiconductor wafer W.

The showerhead 38 disposed at the ceiling includes an electrode plate 56 on the bottom side having a number of gas delivery holes 56a, and an electrode support 58 detachably supporting the electrode plate 56. The electrode support 58 has a buffer space 60 formed therein, which has a gas feed port 60a connected to a process gas supply section 62 through a gas feed line 64.

A magnetic member 66 is disposed around the chamber 10 to extend annularly or concentrically. An RF electric field is formed by the RF power supply 32 to extend vertically in the space between the showerhead 38 and susceptor 12 within the chamber 10. High density plasma is generated near the surface of the susceptor 12 by RF discharge.

A control section 68 is arranged to control the operations of respective parts of the plasma etching apparatus, such as the exhaust apparatus 28, RF power supply 32, electrostatic chuck switch 43, chiller unit 46, heat transmission gas supply unit 52, and process gas supply section 62. The control section 68 is also connected to the host computer (not shown).

When the plasma etching apparatus is used for etching, the following operations are performed. Specifically, at first, the gate valve 30 is opened, and a semiconductor wafer W to be processed is transferred into the chamber 10, and placed on the electrostatic chuck 40. Then, an etching gas (mixture gas in general) is supplied at a predetermined flow rate and flow ratio from the process gas supply section 62 into the chamber 10, while the chamber 10 is exhausted by the exhaust apparatus 28, to set the pressure within the chamber 10 at a set value. In addition, an RF power is applied at a predetermined power level from the RF power supply 32 to the susceptor 12. Further, a DC voltage is applied from the DC power supply 42 to the electrode 40a of the electrostatic chuck 40, so as to fix the semiconductor wafer W onto the electrostatic chuck 40. With this arrangement, the etching gas delivered from the showerhead 38 is turned into plasma by RF discharge between the electrodes 12 and 38. The main surface of the semiconductor wafer W is etched by radicals and ions generated from the plasma.

In this plasma etching apparatus, the RF applied to the susceptor (lower electrode) 12 is selected from a range covering far higher frequencies (for example, 50 MHz or more) than conventional values (typically, 27 MHz or less). As a consequence, the plasma density is increased with a preferable dissociation state, so that high density plasma is formed even under a low pressure condition.

Figure 3:
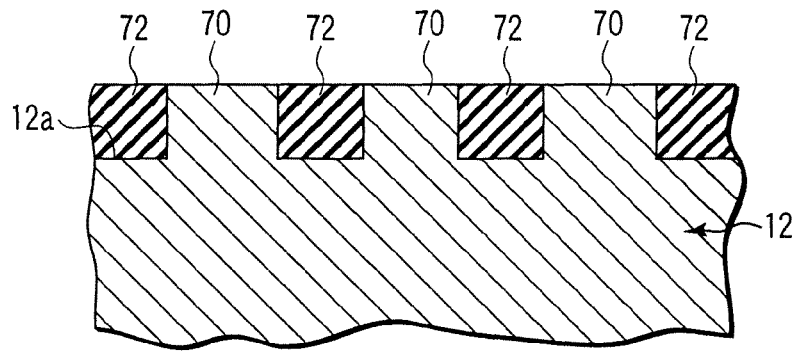
FIG. 3 is an enlarged partial and sectional side view showing the susceptor structure according to the first embodiment.
Figure 4:
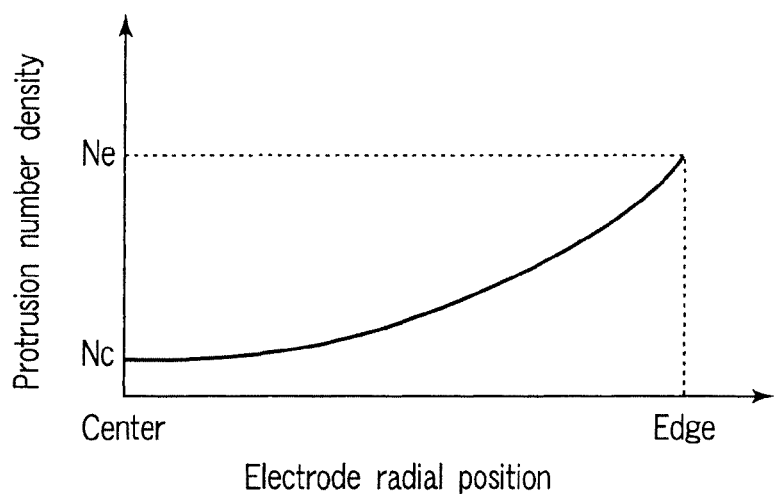
FIG. 4 is a view showing a distribution characteristic concerning the protrusion number density on the susceptor structure according to the first embodiment.

FIG. 2 is a plan view showing a susceptor structure (susceptor 12) according to the first embodiment of the present invention. FIG. 3 is an enlarged partial and sectional side view showing the susceptor structure. FIG. 4 is a view showing a distribution characteristic concerning the protrusion number density on the susceptor structure. The main surface of the susceptor 12 (the top surface of the susceptor 12, i.e., the surface facing the plasma generation space, in this embodiment) is provided with a number of columnar protrusions 70 made of a conductor or semiconductor which have a constant size and are discretely arrayed. Each of the protrusions 70 functions as a small electrode to apply an RF power or RF electric field to plasma. Preferably, as shown in FIG. 4, the protrusions 70 are arrayed on the main surface of the susceptor 12 with a number density distribution or area density distribution such that the density gradually increases from the electrode central portion to the electrode edge portion.

Figure 5:
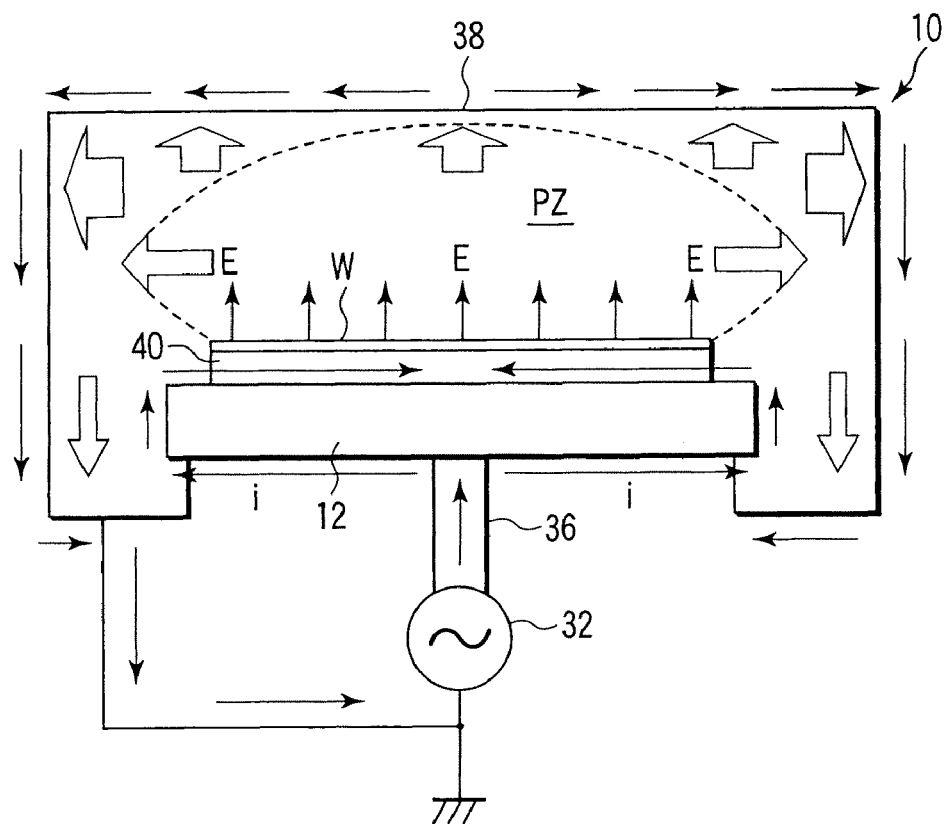
FIG. 5 is a view schematically showing an RF discharge scheme in the plasma etching apparatus shown in FIG. 1.

FIG. 5 is a view schematically showing an RF discharge scheme in the plasma etching apparatus shown in FIG. 1. As shown in FIG. 5, when an RF power is applied from the RF power supply 32 to the susceptor 12, plasma PZ of the etching gas is generated near the semiconductor wafer W by RF discharge between the susceptor (lower electrode) 12 and upper electrode 38. The generated plasma PZ diffuses all around, particularly upward and outward in the radial direction. An electron current or ion current from the plasma PZ flows to ground through the upper electrode 38, chamber sidewall, and so forth.

Figure 6:
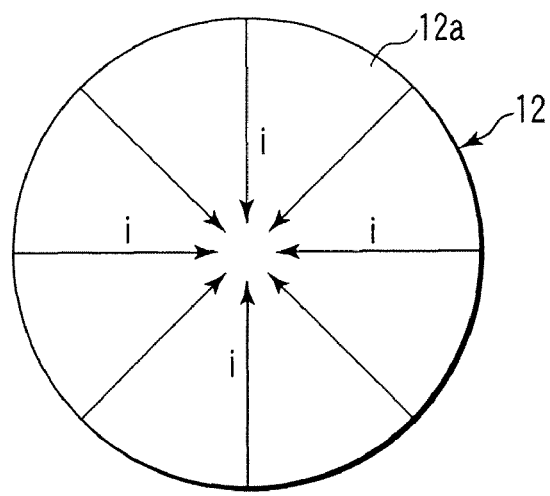
FIG. 6 is a plan view showing the flow directions of an RF current on the main surface of an RF electrode in the plasma etching apparatus shown in FIG. 1.

FIG. 6 is a plan view showing the flow directions of an RF current on the main surface of an RF electrode in the plasma etching apparatus shown in FIG. 1. In the susceptor 12, when an RF power is applied from the RF power supply 32 through the feed rod 36 to the susceptor backside or bottom, it is transmitted through the electrode surface by means of the skin effect. As shown in FIG. 6, on the main surface of the susceptor 12, an RF current i flows convergently from the edge portion to the central portion.

Figure 7:
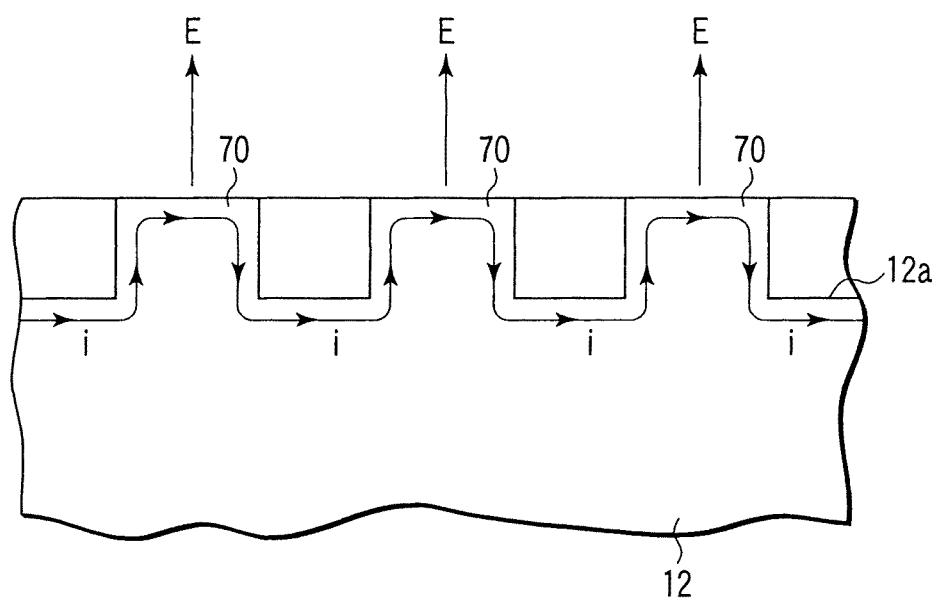
FIG. 7 is a sectional side view schematically showing flows of an RF current and radiations of RF power (electric field) in the susceptor structure according to the first embodiment.

FIG. 7 is a sectional side view schematically showing flows of an RF current and radiations of RF power (electric field) in the susceptor structure (susceptor 12) according to the first embodiment. As shown in FIG. 7, in this embodiment, an RF current i flows through the surface layer of the protrusions 70 on the main surface of the susceptor 12. Since the protrusions 70 protrude toward the upper electrode 38 or plasma PZ, they are electrically coupled with the plasma PZ with a lower impedance, as compared with the bottom portion 12a on the main surface. Accordingly, the RF power carried by the RF current i flowing through the surface layer on the main surface of the susceptor 12 is discharged mainly from the top surface of the protrusions 70 toward the plasma PZ.

As shown in FIG. 3, a dielectric body 72 is preferably disposed around the protrusions 70 (on the bottom portion 12a). With this arrangement, the impedance ratio $Z_{12a}/Z_{70}$ between the protrusions 70 and bottom portion 12a can be set higher on the main surface of the susceptor 12. In other words, it is possible to increase the RF power ratio or power application rate applied to the plasma PZ through the protrusions 70.

As described above, in this embodiment, each of a number of protrusions 70 discretely arrayed on the main surface of the susceptor 12 functions as a small electrode to apply an RF power to the plasma PZ. By suitably selecting properties (shape, size, distance, density, and so forth) of the protrusions 70, the RF power application characteristic of the susceptor 12 or a group of small electrodes can be set as required.

For example, the number density of the protrusions 70 can be set to have a distribution characteristic such that the density gradually increases from the electrode central portion to the electrode edge portion, as described above (see FIG. 4). This arrangement make it possible to improve the uniformity of the RF power or RF electric field (particularly, uniformity in the electrode radial direction) applied from the susceptor 12 to the plasma PZ, as shown in FIG. 9.

Figure 9:
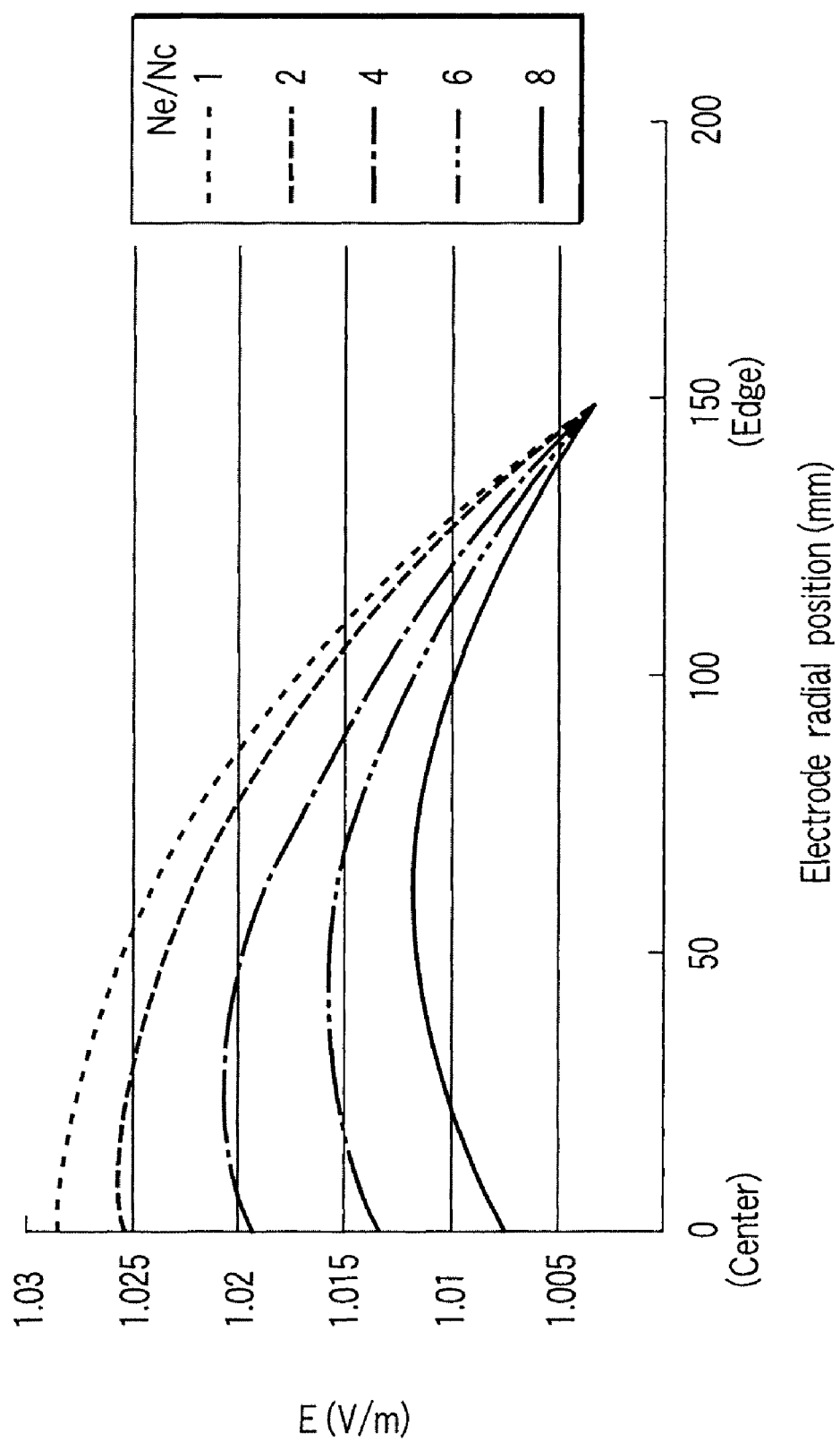
FIG. 9 is a view showing distribution characteristics of electric field intensity in the electrode radial direction, using as a parameter a ratio in protrusion number density between the electrode central portion and edge portion according the first embodiment.

FIG. 9 is a view showing distribution characteristics of electric field intensity in the electrode radial direction, using as a parameter a ratio in protrusion number density between the electrode central portion and edge portion according the first embodiment. FIG. 9 shows distributions of electric field intensity above the susceptor 12 in the radial direction, wherein the radius of the susceptor 12 is set at 150 mm. The ratio Ne/Nc is set at different values, 1 (time), 2 (times), 4 (times), 6 (times), 8 (times), between the number density Nc of the protrusions 70 at the electrode central portion and the number density Ne of the protrusions 70 at the electrode edge portion. The larger the ratio Ne/Nc, the better the uniformity of electric field intensity, and thus the uniformity of plasma density is further improved.

Of the other properties of the protrusions 70, the size thereof is particularly important. If the protrusions 70 are too short, and more specifically shorter than the skin depth (skin depth) δ, part or most of the RF current i passes straight through a position below the protrusions 70 on the main surface of the susceptor 12. In this case, the RF electric field applied from the protrusions 70 to the plasma PZ is attenuated by that much. The skin depth δ is defined such that the amplitude of an RF current flowing through the surface layer of a conductor is attenuated to 1/e at the depth δ. The skin depth δ is a factor expressed by the following formula (1).

$$\delta = (2/\omega\sigma\mu)^{1/2} \qquad (1)$$

In this formula, $\omega = 2\pi f$ (f: frequency), σ: specific electric conductivity, and μ: magnetic permeability.

Figure 8:
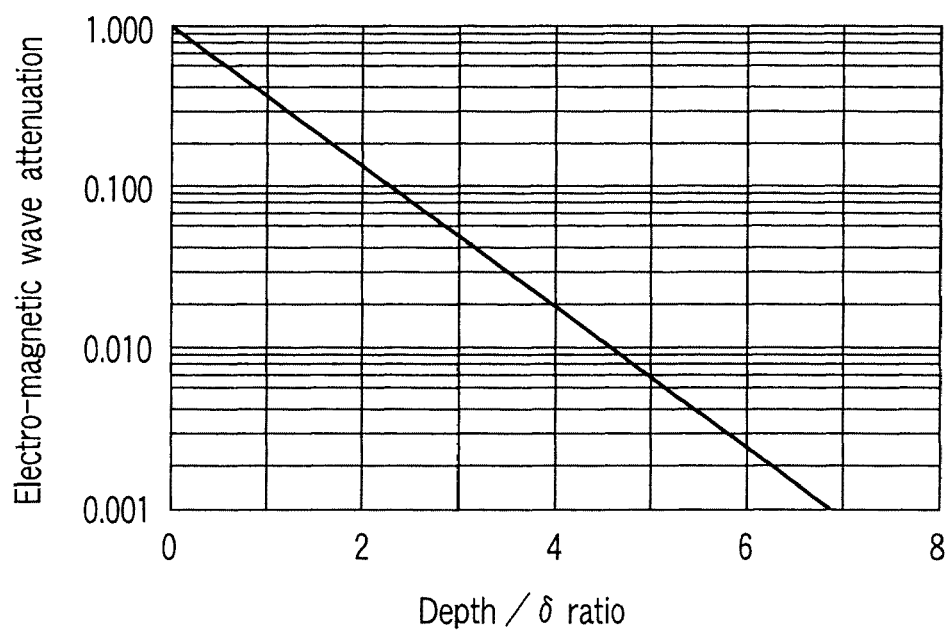
FIG. 8 is a characteristic view showing an attenuation characteristic in the depth direction of an electro-magnetic wave (RF current) flowing through a conductor.

FIG. 8 is a characteristic view showing an attenuation characteristic in the depth direction of an electromagnetic wave (RF current) flowing through a conductor. As shown in FIG. 8, the amplitude of an electromagnetic wave (RF current) flowing through the surface layer of a conductor by means of the skin effect is attenuated in the depth direction of the conductor, and decreases to about 5% at a depth three times larger than the skin depth δ. Accordingly, if the height of the protrusions 70 is set to be three times the skin depth δ or more, most of the RF current i (about 95% or more) can flow into the protrusions 70, thereby efficiently discharging an RF power from the protrusions 70 to the plasma PZ. For example, where the susceptor 12 and protrusions 70 are made of aluminum, and the frequency of the RF power supply 32 is set at 100 MHz, the skin depth δ is 8 μm. Accordingly, the height of the protrusions 70 should be set at 24 μm or more.

The width of the protrusions 70, particularly the width in the electrode radial direction, is also important. The width in the electrode radial direction is preferably larger for the RF current i to sufficiently flow up to the top surface of the protrusions 70. This width may be set to be three times the skin depth δ or more, and preferably to be within a range of 30 μm to 500 μm for a frequency of 100 MHz.

The distance between the protrusions 70 may also be selected to optimize the impedance ratio $Z_{12a}/Z_{70}$ between the protrusions 70 and bottom portion 12a. For example, this distance is preferably set to be within a range of 100 μm to 1 mm for 100 MHz.

FIG. 10 is a sectional side view showing a structure in which an electrostatic chuck is integrally formed with a susceptor according to the first embodiment. As shown in FIG. 10, an electrostatic chuck 40 has a lower insulating film 40b formed on the main surface of the susceptor 12, and more specifically on the protrusions 70 and dielectric body 72. An electrode film 40a is disposed on the lower insulating film 40b, and an upper insulating film 40c is disposed on the electrode film 40a.

FIG. 11 is a view showing the impedance ratio characteristic between the protrusions and bottom portion in the susceptor structure with the electrostatic chuck shown in FIG. 10. In FIG. 11, the horizontal axis denotes as a parameter the ratio $S_{12a}/S_{70}$ between the total area $S_{70}$ of the protrusions 70 (specifically the protrusion top surface) and the total area $S_{12a}$ of the bottom portion 12a on the main surface of the susceptor 12. Further, in FIG. 11, the vertical axis denotes the ratio D2/D1 between the distance (D1) from the top surface of the protrusions 70 to the electrode film 40a and the distance (D2) from the susceptor bottom portion 12a to the electrode film 40a. Functional values in FIG. 11 denote the ratio $Z_{12a}/Z_{70}$ between the impedance $Z_{70}$ of the protrusions 70 and the impedance $Z_{12a}$ of the bottom portion 12a on the main surface of the susceptor 12.

In the multi-layered structure shown in FIG. 10, the film thickness D1 of the lower insulating film 40b of the electrostatic chuck 4 is an important factor. This film thickness D1 is preferably set relatively low, as long as it is compatible with the other conditions. As shown in FIG. 11, as D2/D1 is set larger, $Z_{12a}/Z_{70}$ becomes larger. Judging from FIG. 11, this ratio D2/D1 is preferably set at 2 (times) or more.

Further, the impedance ratio $Z_{12a}/Z_{70}$ (the functional value in FIG. 11) can also be increased, by setting the ratio $S_{12a}/S_{70}$ smaller, i.e., by setting the occupation area ratio of the protrusions 70 higher. As described above, as the impedance ratio $Z_{12a}/Z_{70}$ is set larger, the RF power application rate from the protrusions 70 to the plasma PZ is increased. Judging from FIG. 11, the ratio $S_{12a}/S_{70}$ is preferably set at 4 (times) or less.

FIGS. 12A to 12F are views showing steps of a method of manufacturing the susceptor structure with the electrostatic chuck shown in FIG. 10.

Figure 12A:
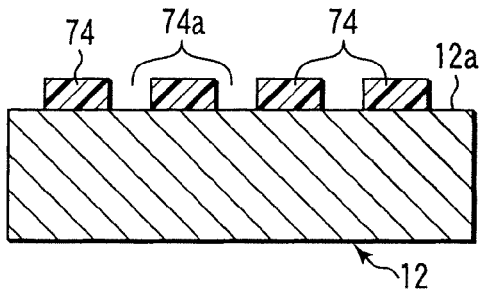
FIGS. 12A to 12F are views showing steps of a method of manufacturing the susceptor structure with the electrostatic chuck shown in FIG. 10.

First, as shown in FIG. 12A, the main surface of a susceptor body (electrode substrate) 12 made of, e.g., aluminum is covered with a mask 74 made of, e.g., a resin and having openings 74a corresponding to protrusions 70. This mask 74 is arranged such that the planar shape and planar size of each of the openings 74a define the planar shape and planar size of each of the protrusions 70. The depth of the openings 74a defines the height of the protrusions 70 (D2-D1: 150 μm, for example).

Figure 12B:
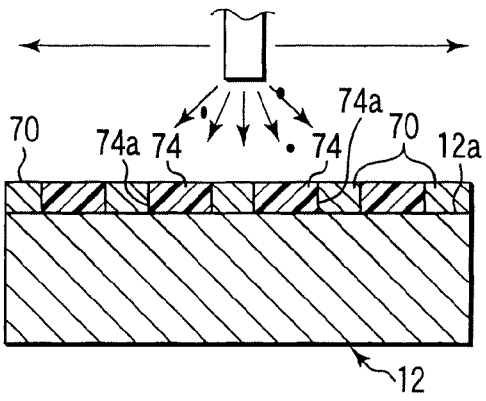

Then, as shown in FIG. 12B, the material of the protrusions 70, such as aluminum (Al), is applied from above the mask 74 by thermal spray, over the entire main surface of the susceptor body 12. The openings 74a of the mask 74 are thereby filled with aluminum up to the height of the mask top surface.

Figure 12C:
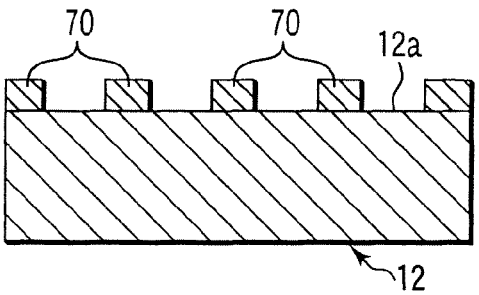

Then, the mask 74 is removed from the main surface of the susceptor body 12 by, e.g. dissolving it with a chemical solution. As a consequence, as shown in FIG. 12C, a number of protrusions 70 with a predetermined size are discretely left in a predetermined distribution pattern on the main surface of the susceptor body 12.

Figure 12D:
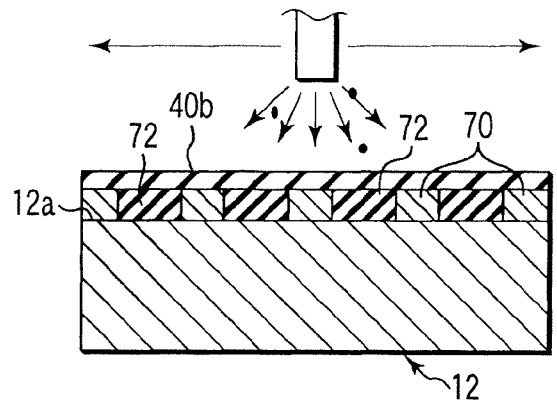

Then, as shown in FIG. 12D, a dielectric body material, such as alumina ($Al_2O_3$), is applied by thermal spray, over the entire main surface of the susceptor body 12. Thus, a dielectric film (72, 40b) is formed to have a film thickness reaching a predetermined height (D1: 50 μm, for example) relative to the top surface of the protrusions 70.

Figure 12E:
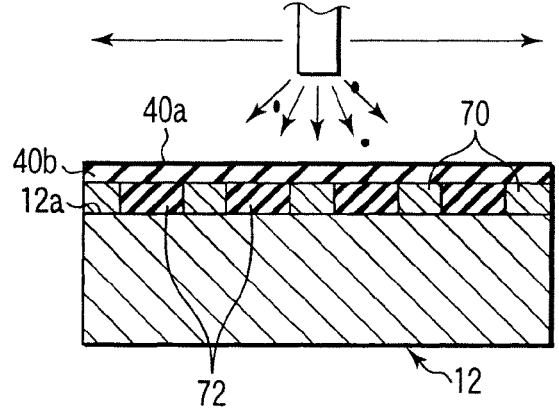

Then, as shown in FIG. 12E, the material of the electrode film 40a of an electrostatic chuck 40, such as tungsten (W), is applied by thermal spray, on the dielectric film 40b over the entire main surface of the susceptor body 12. Thus, an electrode film 40a having a predetermined film thickness (D3: 50 μm, for example) is formed.

Figure 12F:
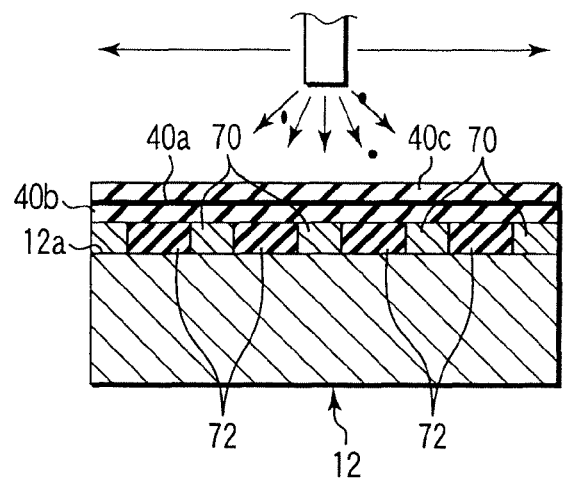

Then, as shown in FIG. 12F, a dielectric body material, such as alumina, is applied by thermal spray, on the electrode film 40a over the entire main surface of the susceptor body 12. Thus, the upper insulating film 40c of the electrostatic chuck 40 is formed to have a predetermined film thickness (D4: 200 μm, for example).

According to this embodiment, the dielectric body 72 filling the portion around the protrusions 70 (to cover the bottom portion 12a) and the lower insulating film 40b of the electrostatic chuck 40 are simultaneously and integrally formed by one thermal spray step on the main surface of the susceptor body 12.

Figure 13:
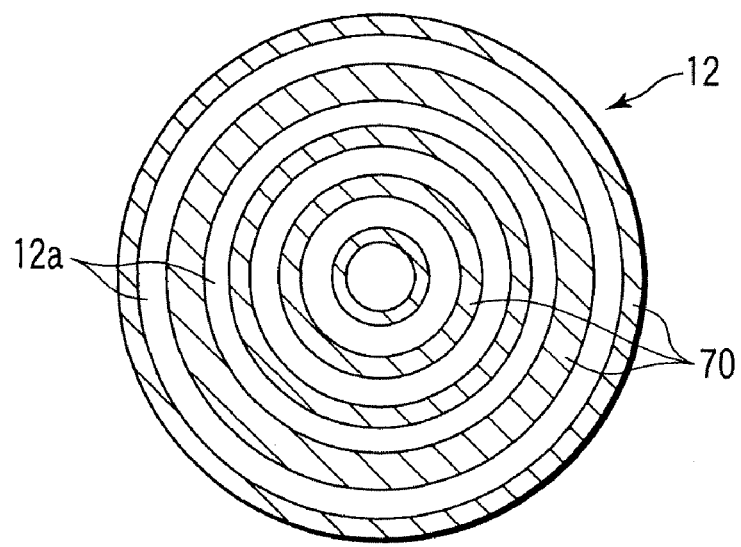
FIG. 13 is a view showing a modified susceptor structure according to the first embodiment.

In the embodiment described above, the protrusions 70 disposed on the main surface of the susceptor 12 are columnar, but the protrusions 70 may have an arbitrary shape. FIG. 13 is a view showing a modified susceptor structure according to the first embodiment. In the modification shown in FIG. 13, a number of annularly protrusions 70 are concentrically disposed. Also in the susceptor structure shown in FIG. 13, when an RF current flows from the electrode edge portion to the central portion, an RF power is efficiently discharged toward the plasma PZ from the protrusions 70 having a lower impedance rather than from the bottom portion 12a. The protrusions 70 are disposed with a distribution characteristic such that the area density gradually increases from the electrode central portion to the electrode edge portion. With this arrangement, the uniformity of electric field intensity is improved, and thus the uniformity of plasma density is improved, in the electrode radial direction.

Figure 14:
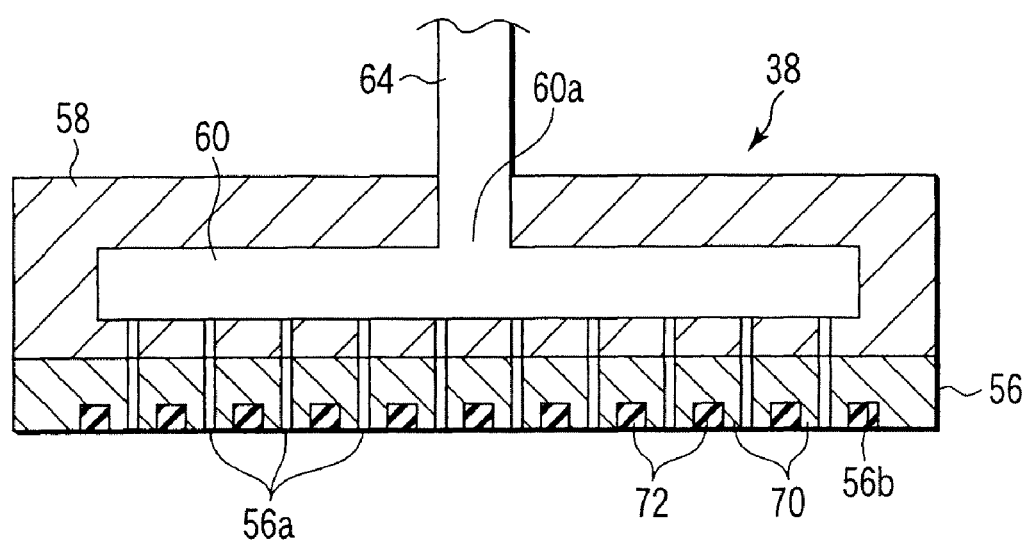
FIG. 14 is a sectional side view showing an arrangement in which an electrode protrusion structure according to the first embodiment is applied to an upper electrode.

FIG. 14 is a sectional side view showing an arrangement in which an electrode protrusion structure according to the first embodiment is applied to an upper electrode. Specifically, a counter electrode or upper electrode 38 may be structured in accordance with the embodiment described above, as shown in FIG. 14, i.e., a number of protrusions 70 functioning as small electrodes are discretely disposed on the main surface of the electrode.

In the structure shown in FIG. 14, the main surface of an electrode plate 56 disposed on a showerhead 38 (the bottom surface, i.e., the surface facing the plasma generation space) is provided with a number of protrusions 70 and a dielectric body 72 filling the portion around the protrusions 70 (on a back portion 56b). Gas delivery holes 56a are formed to vertically pass through the protrusions 70. With this arrangement, the upper electrode 38 receives an RF current from the plasma PZ mainly through the protrusions 70. Accordingly, the uniformity of plasma density is further improved by suitably selecting the properties of the protrusions 70 of the upper electrode 38. For example, the protrusions 70 may be arrayed with a distribution characteristic such that the area density gradually increases from the electrode central portion to the electrode edge portion.

Figure 15:
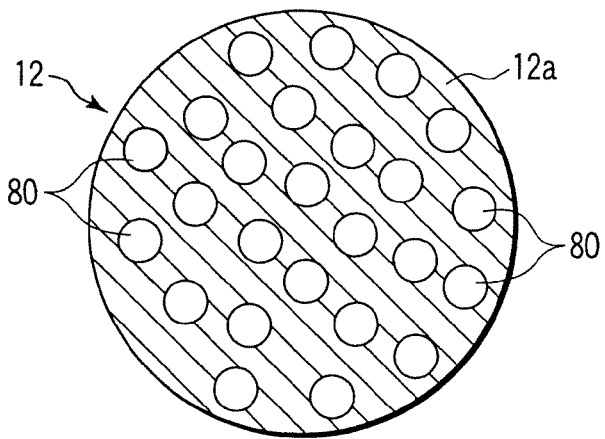
FIG. 15 is a plan view showing an electrode structure according to a second embodiment of the present invention.
Figure 16:
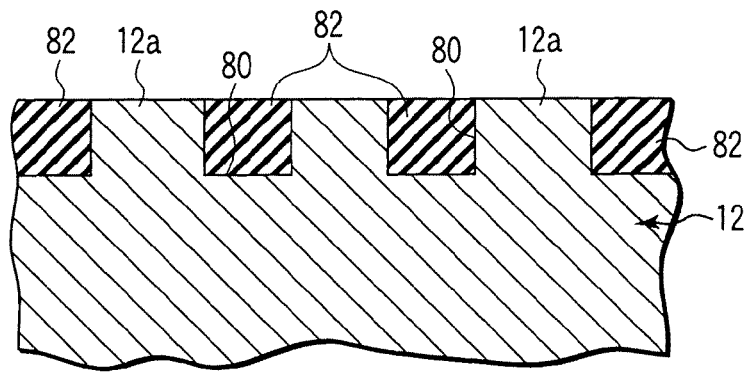
FIG. 16 is an enlarged partial and sectional side view of the electrode structure shown in FIG. 15.
Figure 17:
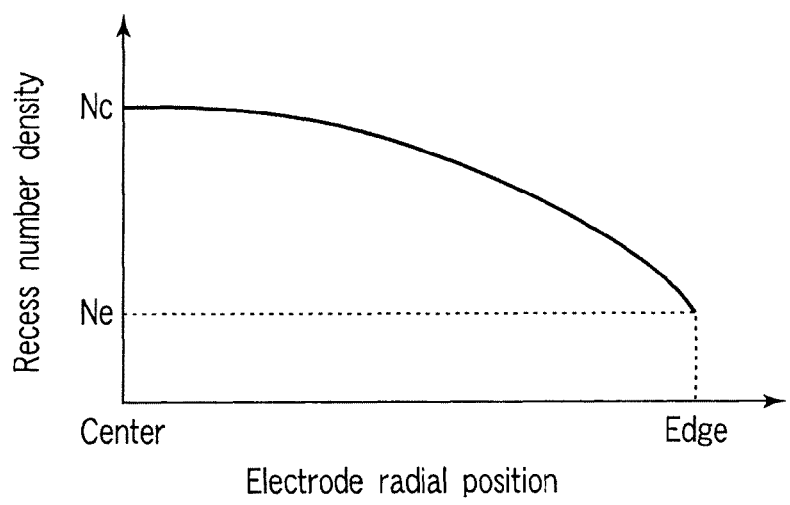
FIG. 17 is a view showing a distribution characteristic concerning the recess number density on the electrode structure shown in FIG. 15.

FIG. 15 is a plan view showing an electrode structure (a susceptor 12) according to a second embodiment of the present invention. FIG. 16 is an enlarged partial and sectional side view of the structure. FIG. 17 is a view showing a distribution characteristic concerning the recess number density on the structure. The main surface of the susceptor 12 is provided with a number of columnar recesses 80 which have a constant size and are discretely arrayed. Since the recesses 80 are dent opposite the counter electrode or plasma PZ, they are electrically coupled with the plasma PZ with a higher impedance than the top portion 12a of the main surface. Accordingly, the RF power carried by an RF current i flowing through the surface layer on the main surface of the susceptor 12 is discharged mainly from the top portion 12a toward the plasma PZ.

As shown in FIG. 16, a dielectric body 82 is preferably disposed in the recesses 80. With this arrangement, the impedance ratio $Z_{80}/Z_{12a}$ between the recesses 80 and top portion 12a can be set higher on the main surface of the susceptor 12. In other words, it is possible to increase the RF power ratio applied to the plasma PZ through the top portion 12a.

As described above, in this embodiment, each of a number of recesses 80 discretely arrayed on the main surface of the susceptor 12 functions as an electrode mask portion to suppress application of an RF power to the plasma PZ. By suitably selecting properties (shape, size, distance, density, and so forth) of the recesses 80, the RF power application characteristic of the susceptor 12 can be set as required.

For example, as shown in FIG. 17, the number density of the recesses 80 can be set to have a distribution characteristic such that the density gradually decreases from the electrode central portion to the electrode edge portion. This arrangement make it possible to improve the uniformity of the RF power or RF electric field (particularly, uniformity in the radial direction) applied from the susceptor 12 to the plasma PZ, and thus improve the uniformity of plasma density. The other properties of the recesses 80 may be treated in accordance with essentially the same idea for those of the protrusions 70 according to the first embodiment. For example, the depth size and width size of the recesses 80 may be set at three times the skin depth δ or more.

FIGS. 18A to 18F are views showing steps of a method of manufacturing an electrode structure with an electrostatic chuck integrally formed therewith, according to the second embodiment.

Figure 18A:
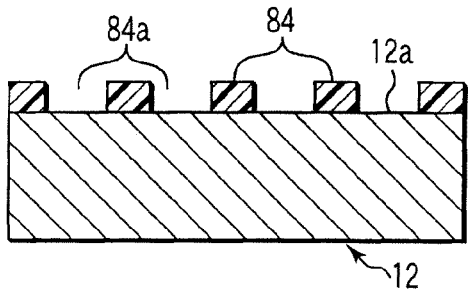
FIGS. 18A to 18F are views showing steps of a method of manufacturing an electrode structure with an electrostatic chuck integrally formed therewith, according to the second embodiment.

First, as shown in FIG. 18A, the main surface of a susceptor body (electrode substrate) 12 made of, e.g., aluminum is covered with a mask 84 made of, e.g., a resin and having openings 84a corresponding to recesses 80. This mask 84 is arranged such that the planar shape and planar size of each of the openings 84a define the planar shape and planar size of each of the recesses 80.

Figure 18B:
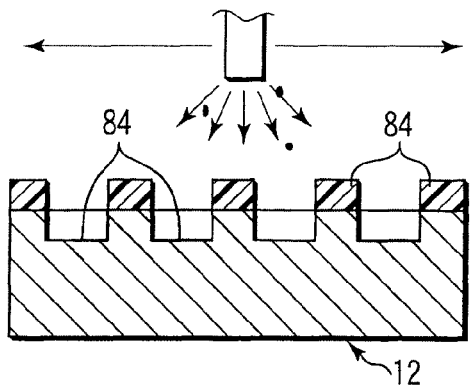

Then, as shown in FIG. 18B, solid particles (e.g., dry ice pellets) or a fluid (e.g., high pressure jet water) is applied from above the mask 84 by a blast method, over the entire main surface of the susceptor body 12. Substances (aluminum) are thereby physically removed in the openings 84a of the mask 84 to form the recesses 80 with a required depth.

Figure 18C:
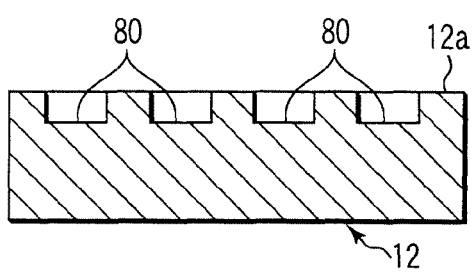

Then, the mask 84 is removed from the main surface of the susceptor body 12. As a consequence, as shown in FIG. 18C, a number of recesses 80 with a predetermined size are discretely left in a predetermined distribution pattern on the main surface of the susceptor body 12.

Figure 18D:
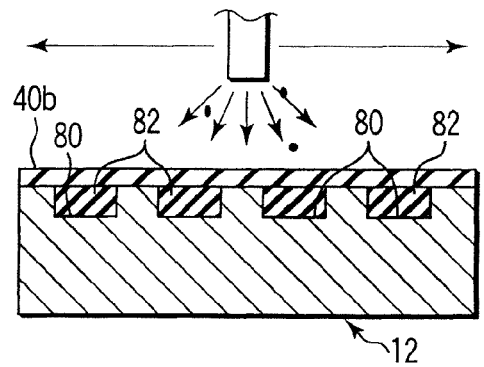

Then, as shown in FIG. 18D, a dielectric body material, such as alumina ($Al_2O_3$), is applied by thermal spray, over the entire main surface of the susceptor body 12. Thus, a dielectric film (82, 40b) is formed to have a film thickness reaching a predetermined height relative to the top portion 12a of the susceptor.

Figure 18E:
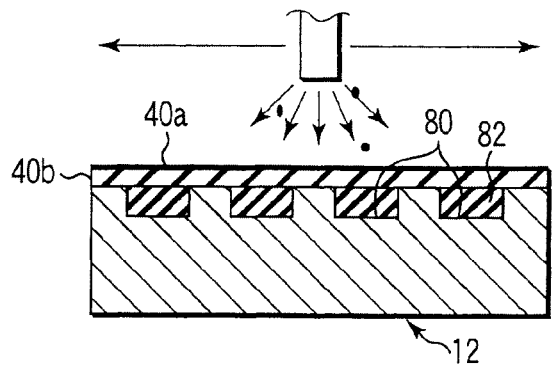

Then, as shown in FIG. 18E, the material of the electrode film of an electrostatic chuck, such as tungsten (W), is applied by thermal spray, on the dielectric film 40b over the entire main surface of the susceptor body 12. Thus, an electrode film 40a having a predetermined film thickness is formed.

Figure 18F:
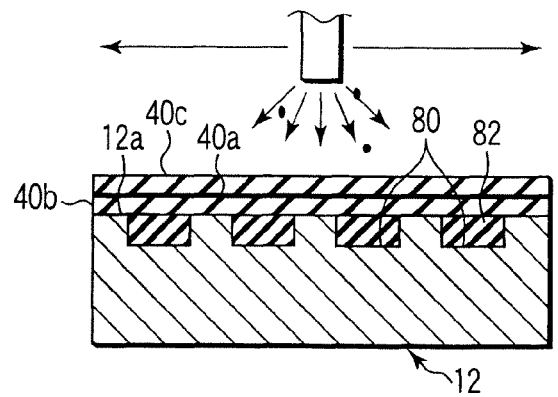

Then, as shown in FIG. 18F, a dielectric body material, such as alumina, is applied by thermal spray, on the electrode film 40a over the entire main surface of the susceptor body 12. Thus, an upper insulating film 40c is formed to have a predetermined film thickness.

Also, according to this embodiment, the dielectric body 82 filling the recesses 80 and the lower insulating film 40b of the electrostatic chuck 40 are simultaneously and integrally formed by one thermal spray step on the main surface of the susceptor body 12.

Further, although not shown, a counter electrode or upper electrode 38 may be structured in accordance with this embodiment, i.e., a number of recesses 80 functioning as electrode mask portions are discretely disposed on the main surface of the electrode. Accordingly, there may be a design such that a susceptor 12 is provided with protrusions 70 while an upper electrode 38 is provided with recesses 80, or a design such that a susceptor 12 is provided with recesses 80 while an upper electrode 38 is provided with protrusions 70.

FIGS. 19 and 20 are plan views showing a lower electrode structure and an upper electrode structure according to a third embodiment, respectively. Specifically, FIG. 19 shows a structure of a susceptor 12 to which the third embodiment is applied. FIG. 20 shows a structure of an upper electrode 38 (to be precise, an electrode plate 56) to which the third embodiment is applied.

According to this embodiment, the main surface of an electrode or the surface facing the plasma generation space (i.e., the bottom surface of an upper electrode 38 or the top surface of a susceptor 12) is provided with a dielectric film or dielectric layer 90. The dielectric film 90 is set to have a larger film thickness at the electrode central portion than at the electrode edge portion. The front surface of the dielectric film 90 (the surface facing the plasma generation space) is essentially flat. This dielectric film or dielectric layer 90 may be formed by applying a ceramic, such as alumina ($Al_2O_3$), by thermal spray to an electrode substrate made of, e.g., aluminum.

In this electrode structure, the electrode central portion has a higher impedance to the plasma PZ than the electrode edge portion. Accordingly, an RF electric field is formed such that the intensity is enhanced at the electrode edge portion while it is weakened at the electrode central portion. As a consequence, the uniformity of the electric field intensity or plasma density is improved. Particularly, in the structure shown in FIG. 19, an electric current flowing from the backside of the electrode 12 to the main surface by means of the skin effect and then into the dielectric film 90 can be more easily discharged from a portion of the film 90 with a smaller film thickness (a thinner portion of the dielectric layer). For this reason, the RF power discharge and plasma density are enhanced at the electrode edge portion.

Figure 21:
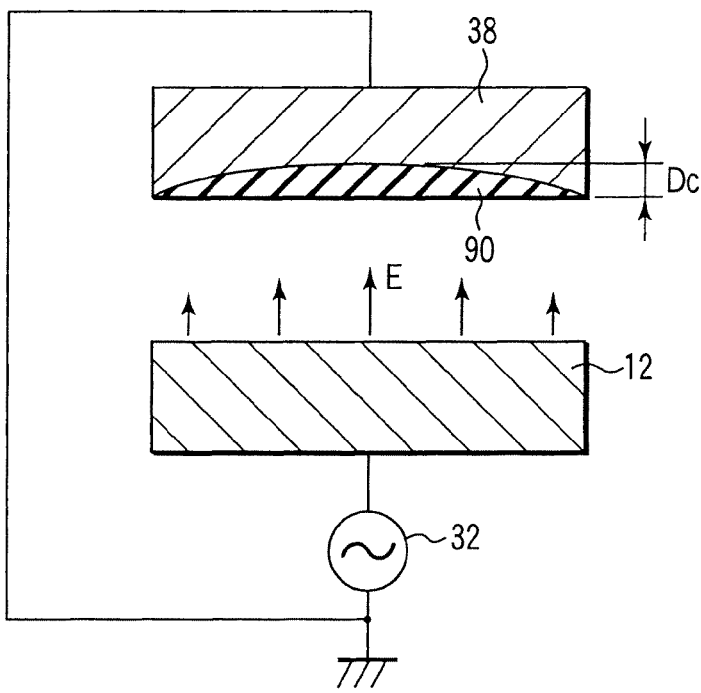
FIG. 21 is a view showing a parallel-plate electrode structure according to third embodiment.
Figure 22:
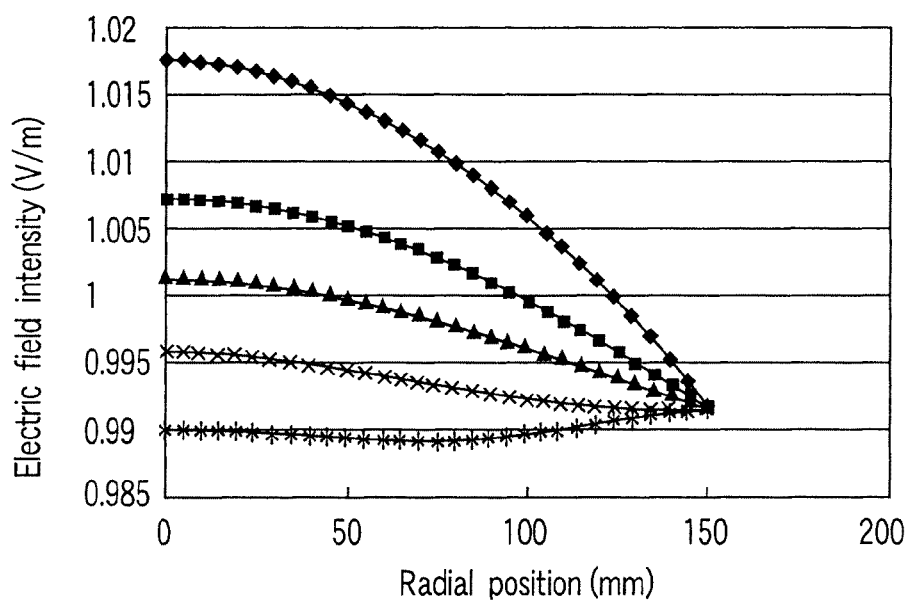
FIG. 22 is a view showing distribution characteristics of electric field intensity in the electrode radial direction, using as a parameter the film thickness at the upper electrode central portion of the parallel-plate electrode structure shown in FIG. 21.

FIG. 21 is a view showing a parallel-plate electrode structure according to third embodiment. FIG. 22 is a view showing distribution characteristics of electric field intensity in the radial direction between electrodes, using as a parameter the film thickness at the upper electrode central portion of the parallel-plate electrode structure shown in FIG. 21. The film thickness at the electrode central portion is one of the important parameters among distribution characteristics of the film thickness of the dielectric film 90. As shown in FIG. 21, in the parallel-plate electrode structure including an upper electrode 38 with a circular dielectric film 90 disposed thereon, the distribution of electric field intensity in the radial direction between the electrodes was obtained by simulation, using as a parameter the film thickness Dc at the upper electrode central portion.

In this simulation, it was assumed that the target substrate was a semiconductor wafer with a diameter of 300 mm, the upper electrode 38 was made of aluminum, the dielectric film 90 was made of alumina ($Al_2O_3$), and the lower electrode 12 was made of aluminum. As shown in FIG. 22, the planar uniformity of electric field intensity was improved with increase in the film thickness of the electrode central portion within a range of 0.5 mm to 10 mm. Particularly, the film thickness within a range of 8 mm to 10 mm was preferable. In FIG. 22, the position "0" in the horizontal axis denotes the electrode central point.

Further, such a profile is also important in that the film thickness of the dielectric film 90 is gradually reduced from the electrode central portion to the electrode edge portion. FIGS. 23A to 23D are views showing specific present examples concerning the film thickness profile of the dielectric film on an upper electrode according to the third embodiment. FIGS. 24A and 24B are views showing distribution characteristics of electric field intensity in the radial direction between electrodes, obtained by the present examples shown in FIGS. 23A to 23D and an ideal profile.

Figure 23A:
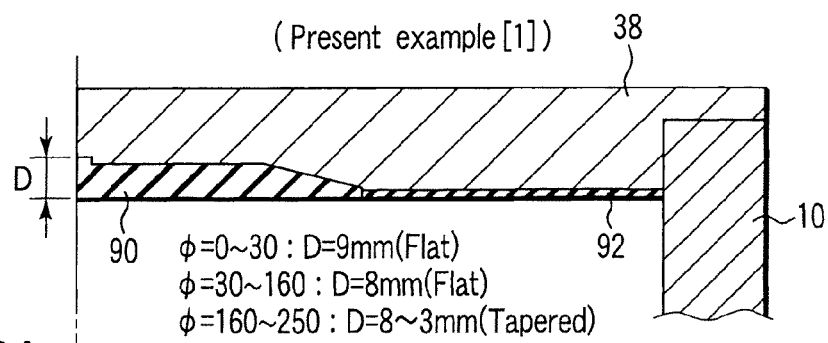
FIGS. 23A to 23D are views showing specific present examples concerning the film thickness profile of a dielectric film on an upper electrode according to the third embodiment.
Figure 23B:
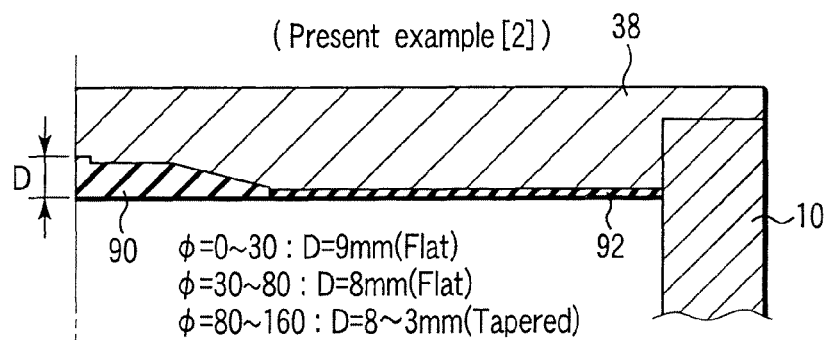
Figure 23C:
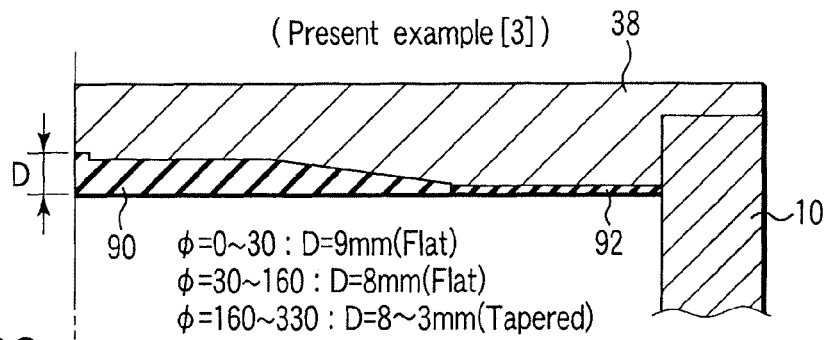

In a present example [1] shown in FIG. 23A, the film thickness D of the dielectric film 90 is set such that D=9 mm (flat or constant) within a region of φ (diameter)=0 to 30 mm, D=8 mm (flat) within φ=30 to 160 mm, and D=8 to 3 mm (tapered) within φ=160 to 254 mm. In a present example [2] shown in FIG. 23B, D is set such that D=9 mm (flat) within φ=0 to 30 mm, D=8 mm (flat) within φ=30 to 80 mm, and D=8 to 3 mm (tapered) within φ=80 to 160 mm. In a present example [3] shown in FIG. 23C, D is set such that D=9 mm (flat) within φ=0 to 30 mm, D=8 mm (flat) within φ=30 to 160 mm, and D=8 to 3 mm (tapered) within φ=160 to 330 mm.

Figure 23D:
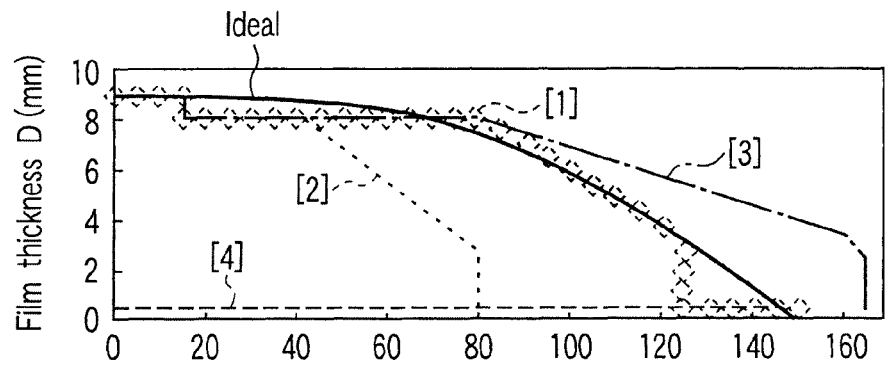

FIG. 23D simply shows the profiles of the present examples [1], [2], and [3] by means of lines. Further, FIG. 23D also shows the profile of a present example [4] where D=0.5 mm (flat) within φ=0 to 150 mm, and an ideal profile, although their sectional shapes are not shown. In the ideal profile, D is set such that D=9 to 0 mm (arch-shape) within φ=0 to 300 mm.

As shown in FIGS. 24A and 24B, the ideal profile shows the most preferable planar uniformity, concerning the distribution characteristic of electric field intensity. Of the present examples [1], [2], [3], and [4], the present examples [1] and [3] show the best planar uniformity closest to that obtained by the ideal profile.

Since the upper electrode 38 (electrode plate 56) receives an RF current from diffused plasma PZ, its edge portion can be extended outward in the radial direction to have a larger diameter than the target substrate. The main surface of the upper electrode 38 may be provided with a thermal spray film 92 having a film thickness of, e.g., 20 μm around the dielectric film 90 or outside thereof in the radial direction. Although not shown, the inner wall surface of the chamber 10 may also be provided with a similar thermal spray film 92. The thermal spray film 92 is made of, e.g., $Al_2O_3$ or $Y_2O_3$. The front surface or surface exposed to plasma of the dielectric film 90 and thermal spray film 92 is essentially flat.

FIGS. 25A to 25D are views showing other specific present examples concerning the film thickness profile of a dielectric film on an upper electrode according to the third embodiment. FIGS. 26A and 26B are views showing distribution characteristics of electric field intensity in the radial direction between electrodes, obtained by the present examples shown in FIGS. 25A to 25D.

Figure 25A:
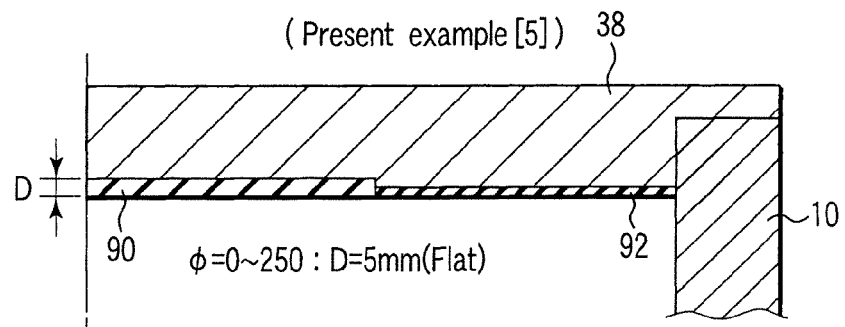
FIGS. 25A to 25D are views showing other specific present examples concerning the film thickness profile of a dielectric film on an upper electrode according to the third embodiment.
Figure 25B:
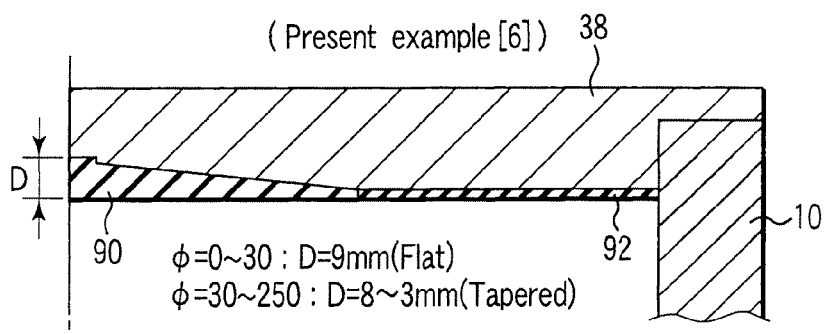
Figure 25C:
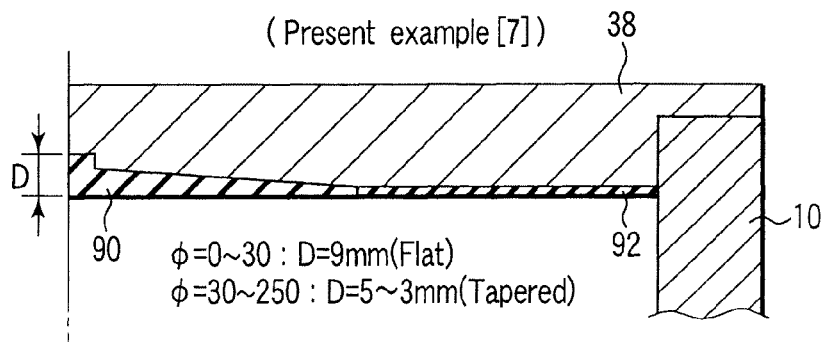
Figure 25D:
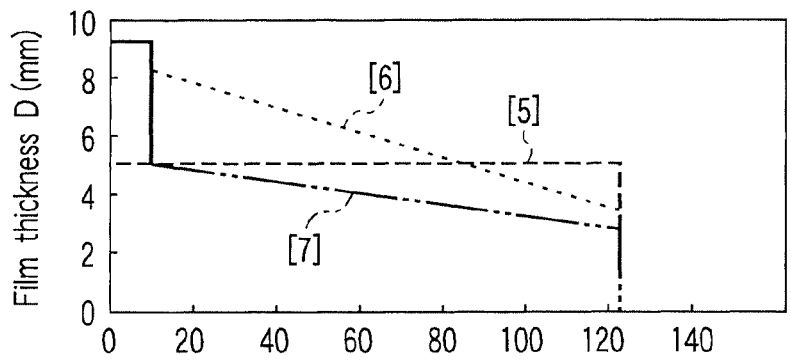

In a present example [5] shown in FIG. 25A, the film thickness D of the dielectric film 90 is set such that D=5 mm (flat) within a region of φ=0 to 250 mm. In a present example [6] shown in FIG. 25B, D is set such that D=9 mm (flat) within φ=0 to 30 mm, and D=8 to 3 mm (tapered) within φ=30 to 250 mm. In a present example [7] shown in FIG. 25C, D is set such that D=9 mm (flat) within φ=0 to 30 mm, and D=5 to 3 mm (tapered) within φ=30 to 250 mm. FIG. 25D simply shows the profiles of the present examples [5], [6], and [7] by means of lines.

As shown in FIGS. 26A and 26B, of the present examples [5], [6], and [7], the present example [6] shows the most preferable planar uniformity closest to that obtained by the ideal profile. However, the present example [5] also well provides a practical use. In other words, as in the present example [6], even where the profile is formed such that the film thickness D of the dielectric film 90 decreases essentially linearly or taper-wise from the electrode central portion to the electrode edge portion, the planar uniformity thereby obtained can be close to that obtained by the arch-shaped ideal profile. Further, as in the present example [5], even where the profile is formed such that the film thickness D of the dielectric film 90 is almost constant (flat) from the electrode central portion to the electrode edge portion, the planar uniformity thereby obtained can have a practical use.

Figure 27A:
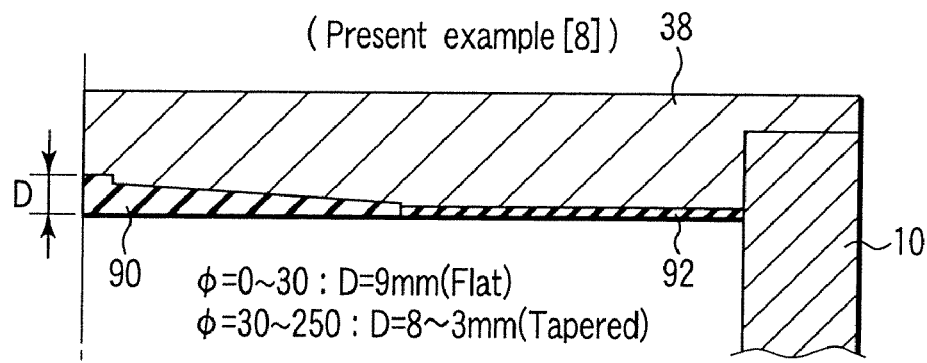
FIGS. 27A to 27C are views showing other specific present examples concerning the film thickness and film quality profiles of a dielectric film on an upper electrode according to the third embodiment.
Figure 27B:
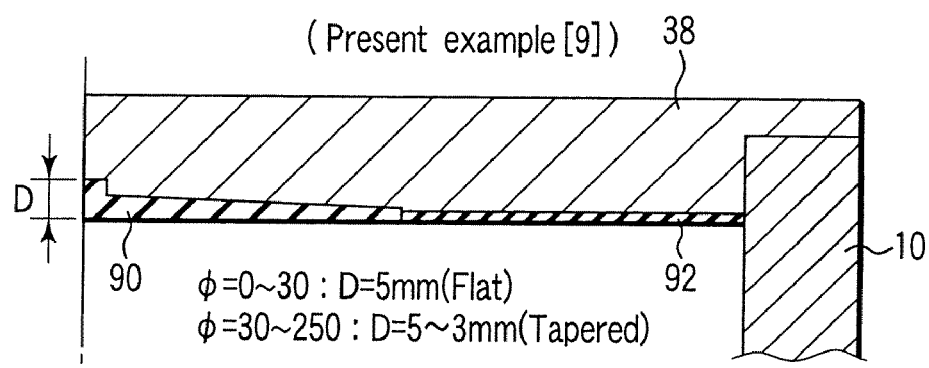
Figure 27C:
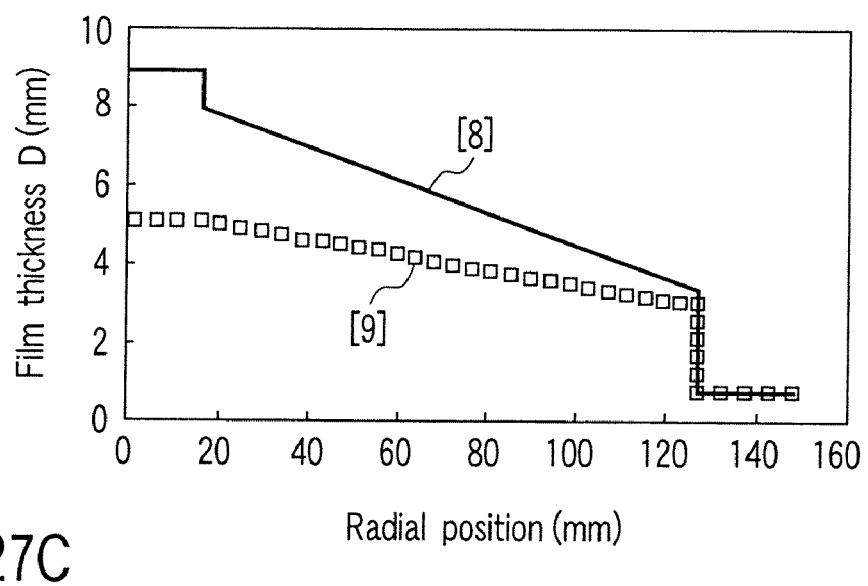

FIGS. 27A to 27C are views showing other specific present examples concerning the film thickness and film quality profiles of a dielectric film on an upper electrode according to the third embodiment. FIGS. 28A and 28B are views showing distribution characteristics of electric field intensity in the radial direction between electrodes, obtained by the present examples shown in FIGS. 27A to 27C.

In a present example [8] shown in FIG. 27A, the film thickness D of the dielectric film 90 is set such that D=9 mm (flat) within a region of φ=0 to 30 mm, and D=8 to 3 mm (tapered) within φ=30 to 250 mm. In a present example [9] shown in FIG. 27B, D is set such that D=5 mm (flat) within φ=0 to 30 mm, and D=5 to 3 mm (tapered) within φ=30 to 250 mm. FIG. 27C simply shows the profiles of the present examples [8] and [9] by means of lines.

The present example [8] includes present examples [8]-A and [8]-B different from each other, in terms of their dielectric constant E as a parameter. As the material of the dielectric film 90, the present examples [8]-A and [8]-B employ alumina ($Al_2O_3$) with a dielectric constant E=8.5 and silicon oxide ($SiO_2$) with ∈=3.5, respectively. The present example [9] also includes present examples [9]-A and [9]-B, which employ alumina ($Al_2O_3$) with E=8.5 and silicon oxide ($SiO_2$) with ∈=3.5, respectively.

As shown in FIGS. 28A and 28B, of the present examples [8]-A and [9]-A both with E=8.5, the [8]-A having a larger film thickness Dc of the electrode central portion is better than the [9]-A in the planar uniformity of electric field intensity E. Of the present examples [8]-B and [9]-B both with ∈=3.5, the [9]-B having a smaller film thickness Dc of the electrode central portion is better than the [8]-B in the planar uniformity of electric field intensity E.

FIG. 29 is a view showing the correlation between the dielectric constant $\in$ of a dielectric film 90 and the film thickness Dc at the electrode central portion, the dielectric film 90 being designed to provide a practically sufficient planar uniformity in accordance with data points in FIGS. 28A and 28B. As shown in this graph, the film thickness Dc at the central portion is preferably set in accordance with the dielectric constant $\in$ of the dielectric film 90.

FIGS. 30A and 30B are views showing distribution characteristics of organic film etching rate, obtained in a present example A of an upper electrode according to the third embodiment and a comparative example B, respectively, for comparison. They show distribution characteristics of organic film etching rate (in X and Y directions) obtained by the plasma etching apparatus (FIG. 1) according to the embodiment. The present example A uses a dielectric film 90 according to the third embodiment on the upper electrode 38. The comparative example B uses no dielectric film 90 on the upper electrode 38. The present example A corresponds to the present example [1]. The main etching conditions employed here are as follows.

Wafer Diameter: 300 mm
Etching Gas: $NH_3$
Gas Flow Rate: 245 sccm
Gas Pressure: 30 mTorr
RF Power: lower side=2.4 kW
Wafer Backside Pressure (central portion/edge portion): 20/30 Torr (He gas)
Temperature (chamber sidewall/upper electrode/lower electrode)=60/60/20° C.

As shown in FIGS. 30A and 30B, the present example A is far better than the comparative example B also in the planar uniformity of etching rate, as in the distribution characteristic of electric field intensity.

FIGS. 31A and 31B are views showing a present example of a lower electrode according to the third embodiment and a comparative example, respectively, for comparison. In the present example A shown in FIG. 31A, with reference to a semiconductor wafer W with a diameter of 300 mm, the film thickness D of a dielectric film 90 on the susceptor 12 is set at 4 mm at the electrode central portion, and at 200 μm at the electrode edge portion. In the comparative example B shown in FIG. 31B, a dielectric film 94 with a uniform film thickness of 0.5 mm is disposed on the top surface of the susceptor 12. Each of the dielectric films 90 and 94 may be made of alumina ($Al_2O_3$).

FIGS. 32A and 32B are views showing distribution characteristics of organic film etching rate, obtained in the present example A shown in FIG. 31A and the comparative example B shown in FIG. 31B, respectively, for comparison. They show distribution characteristics of organic film etching rate (in X and Y directions) obtained by the plasma etching apparatus (FIG. 1) according to the embodiment. The etching conditions are the same as those for FIGS. 30A and 30B.

As shown in FIGS. 32A and 32B, also in the case of the susceptor (lower electrode) 12, the present example A is far better than the comparative example B in the planar uniformity of etching rate. Further, in terms of the value of etching rate, the present example A is larger than the comparative example B by about 10%. As regards the film thickness D of the dielectric film 90 at the electrode central portion, although that of the present example A is 4 mm, the same effect can be obtained by a thickness up to about 9 mm.

FIGS. 33A and 33B are partial and sectional views showing present examples of an upper electrode structure according another embodiment of the present invention. This embodiment may be preferably applied to a structure where an upper electrode 38 is provided with a dielectric film 90.

As shown in FIGS. 33A and 33B, the dielectric film 90 disposed on the main surface of the upper electrode 38 is covered with a conductive shield plate 100 in part (typically near the edge portion). This shield plate 100 is formed of, e.g., an aluminum plate with an alumite-processed surface (92), and preferably attached to the upper electrode 38 by screws 102 as a detachable or replaceable member. The shield plate 100 has an opening 100a with a required diameter θ at the central portion, which is concentric with the dielectric film 90 and exposes at least the central portion of the dielectric film 90. The thickness of the shield plate 100 may be set at, e.g., about 5 mm.

More specifically, θ=200 mm in the present example A shown in FIG. 33A, and θ=150 mm in the present example B shown in FIG. 33B. In either of the present examples A and B, the dielectric film 90 is a disc with a diameter of 250 mm, and has a film thickness profile set such that D=8 mm (flat) within φ=0 to 160 mm, and D=8 to 3 mm (tapered) within φ=160 to 250 mm.

FIG. 34 is a view showing distribution characteristics of electric field intensity in the radial direction between electrodes, obtained by the present examples shown in FIGS. 33A and 33B. As shown in FIG. 34, where the dielectric film 90 is partly covered with the conductive shield plate 100, the influence of the dielectric film 90 or reduction of electric field intensity is remarkably attenuated or cancelled at the covered portion. Accordingly, by adjusting the diameter θ of the opening 100a of the shield plate 100 (by replacing the shield plate 100 with another one), the distribution characteristic of electric field intensity can be adjusted between the electrodes 12 and 38.

FIGS. 35A to 35C are partial and sectional views showing a present example of an upper electrode structure according to another embodiment of the present invention, a comparative example, and a reference example, respectively. This embodiment may also be preferably applied to a structure where an upper electrode 38 is provided with a dielectric film 90.

As shown in FIG. 35A, in this embodiment, an electrode portion 38f on the main surface of the upper electrode 38 radially outside the dielectric film 90 (or outside from a diameter of ω) protrudes toward the susceptor 12 or toward the plasma generation space by a required protruding amount (or extending amount) h. In other words, the electrode portion 38f provides an inter-electrode gap Gf smaller than an inter-electrode gap G0 at the dielectric film 90.

In the present example A shown in FIG. 35A, the dielectric film 90 with a diameter of 80 mm has a film thickness profile set such that D=3 mm (flat) within φ=0 to 60 mm, D=3 to 1 mm (tapered) within φ=60 to 80 mm, and ω=260 mm. With reference to an inter-electrode gap Go=40 mm at the dielectric film 90, it is set such that h=10 mm and thus an inter-electrode gap Gf=30 mm. The outer electrode protrusion 38f has a protrusion shoulder inclined by about 60°. This inclination angle can be arbitrarily set.

In the comparative example B shown in FIG. 35B, the upper electrode 38 is provided with no protrusion 38f, but with a dielectric film 90 having the same diameter and film thickness profile as those of the present example A. In the present example C shown in FIG. 35C, the upper electrode 38 is provided with no protrusion 38f or dielectric film 90. In either of FIGS. 35B and 35C, the inter-electrode gap is constant at Go=40 mm in the radial direction.

FIG. 36 is a view showing distribution characteristics of electric field intensity in the radial direction between electrodes, obtained by the present example A, comparative example B, and reference example C shown in FIGS. 35A to 35C. As shown in FIG. 36, according to the present example A, the protrusion 38f disposed outside the dielectric film 90 allows the distribution characteristic of electric field intensity to be controlled or adjusted such that the electric field intensity E becomes higher near the edge of the semiconductor wafer W (a region within a radius of about 90 mm to 150 mm from the center, in this example). This adjustment of the electric field intensity distribution by the protrusion 38f can be controlled by the protruding amount h, which is preferably set at h=10 mm or more.

Figure 37A:
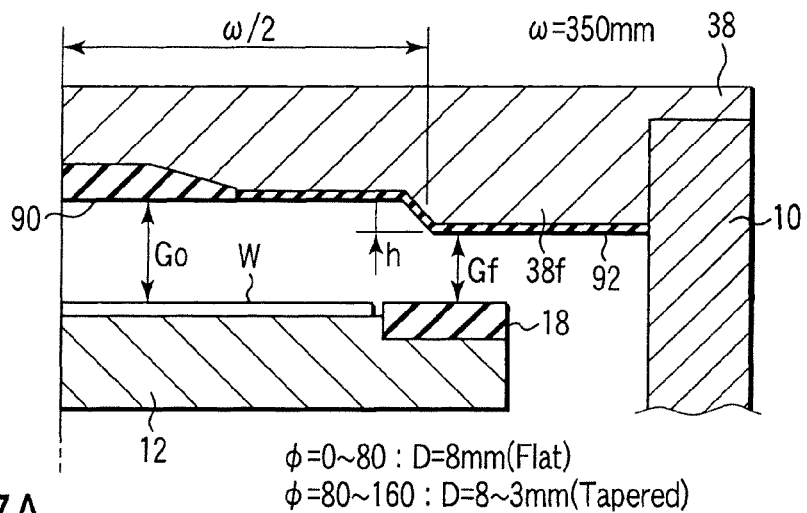
FIGS. 37A to 37C are partial and sectional views showing other present examples of an upper electrode structure, and a comparative example, respectively.
Figure 37B:
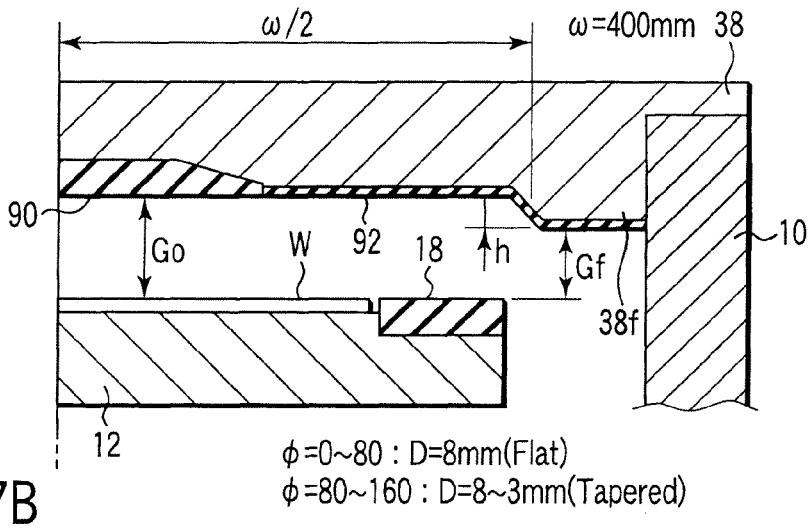
Figure 37C:
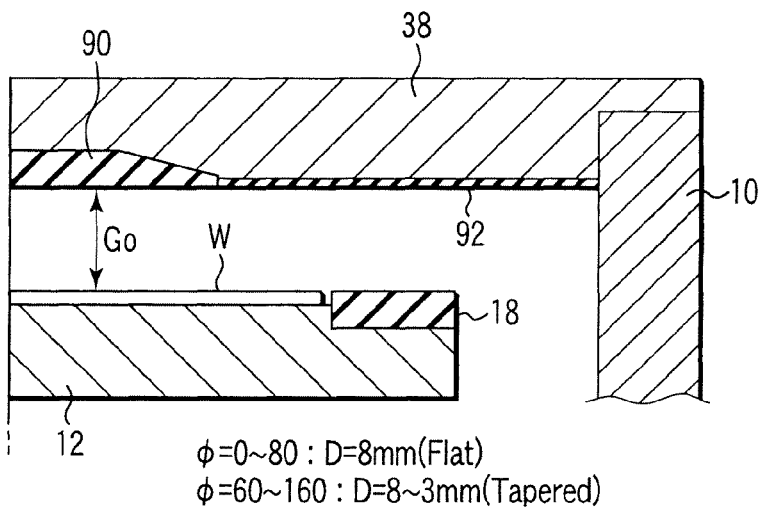

The position of the protrusion shoulder of the outer electrode protrusion 38f (a value of the diameter ω.) can be arbitrarily selected. FIGS. 37A to 37C are partial and sectional views showing other present examples of an upper electrode structure, and a comparative example, respectively.

The present example A shown in FIG. 37A is set at ω=350 mm, and the present example B shown in FIG. 37B is set at ω=400 mm. In either of the present examples A and B, the dielectric film 90 has a film thickness profile set such that D=8 mm (flat) within φ=0 to 60 mm, and D=8 to 3 mm (tapered) within φ=80 to 160 mm. With reference to an inter-electrode gap Go=30 mm at the dielectric film 90, it is set such that the protruding amount h=10 mm and thus an inter-electrode gap Gf=20 mm. The outer electrode protrusion 38f has a protrusion shoulder inclined by about 60.degree.

In the comparative example C shown in FIG. 37C, the upper electrode 38 is provided with no protrusion 38f, but with a dielectric film 90 having the same diameter and film thickness profile as those of the present examples A and B. The inter-electrode gap is constant at Go=30 mm in the radial direction.

FIG. 38 is a view showing distribution characteristics of oxide film etching rate (normalized value), obtained by the present examples A and B and comparative example C, shown in FIGS. 37A to 37C. AS regards the main etching conditions, the wafer diameter is 300 mm, the pressure is 15 mTorr, and the process gas is $C_4F_6/Ar/O_2/CO$. In the present examples A and B shown in FIGS. 37A and 37B, the protrusion shoulder of the outer electrode protrusion 38f formed on the main surface of the upper electrode 38 is located outside the edge of the semiconductor wafer W in the radial direction. As shown in FIG. 38, according to this arrangement, as the position of the protrusion shoulder is closer to the wafer edge (as ω decreases), the effect of increasing the etching rate (or electric field intensity or plasma electrons density) near the wafer edge (a region within a radius of about 70 mm to 150 mm from the center, in this example) is enhanced.

Figure 39A:
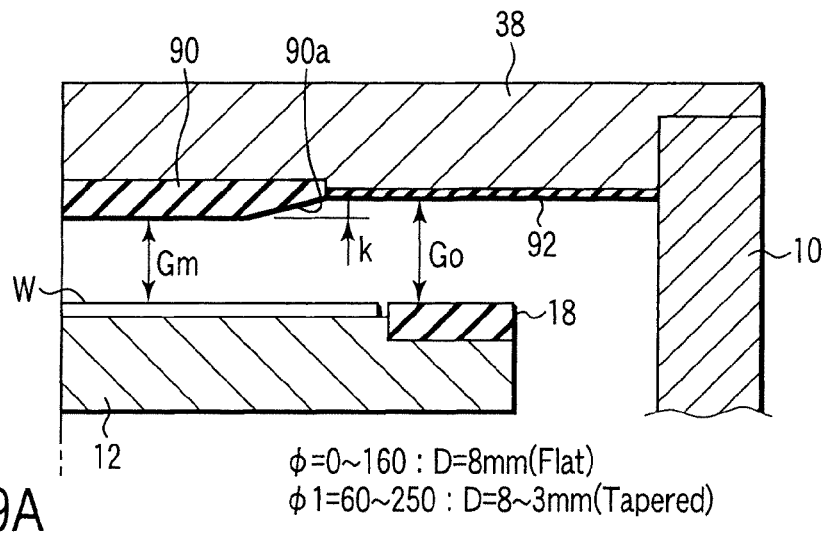
FIGS. 39A to 39C are partial and sectional views showing a present example of an upper electrode structure according to another embodiment of the present invention, a comparative example, and a reference example, respectively.
Figure 39B:
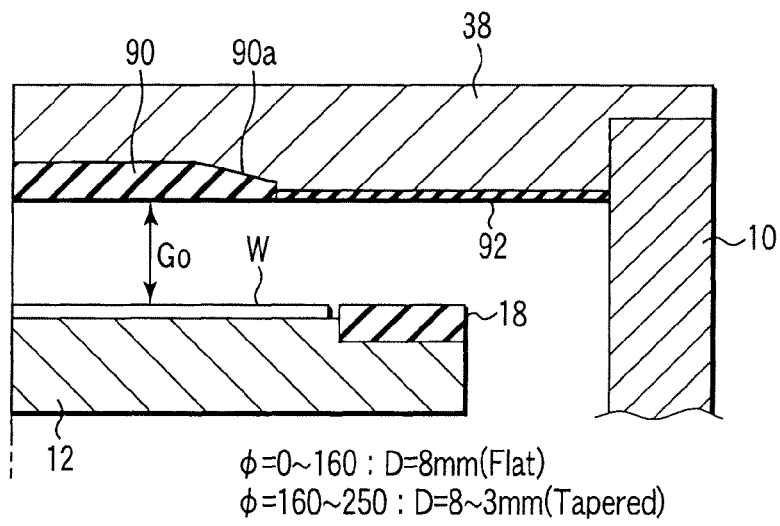
Figure 39C:
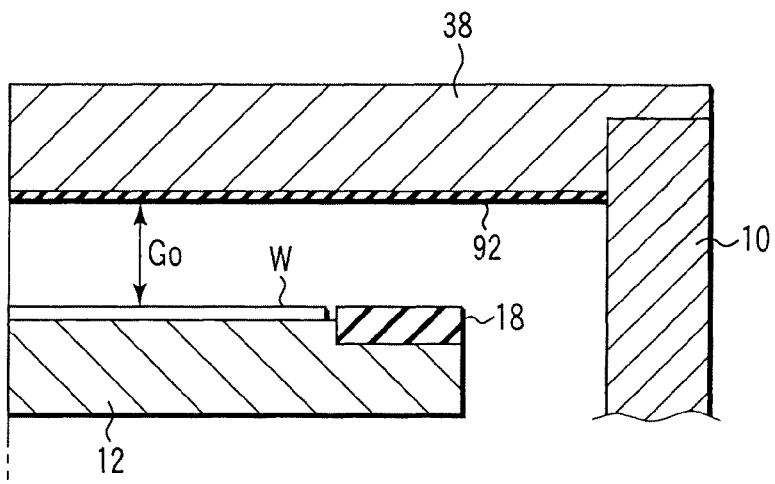

In the embodiments shown in FIGS. 35A to 38, as described above, an electrode portion on the main surface of the upper electrode 38 radially outside the dielectric film 90 protrudes toward the plasma generation space. To the contrary, as shown in FIG. 39A, the dielectric film 90 on the main surface of the upper electrode 38 may protrude toward the plasma generation space by a required protruding amount (or extending amount) k. FIGS. 39A to 39C are partial and sectional views showing a present example of an upper electrode structure according to another embodiment of the present invention, a comparative example, and a reference example, respectively.

In the present example A shown in FIG. 39A, the dielectric film 90 with a diameter of 250 mm has a film thickness profile set such that D=8 mm (flat) within φ=0 to 160 mm, and D=8 to 3 mm (tapered) within φ=160 to 250 mm. A tapered surface 90a is set at k=5 mm toward the susceptor 12, and thus the dielectric film 90 provides an inter-electrode gap Gm=35 mm. The electrode portion outside the dielectric film 90 in the radial direction is flat and provides an inter-electrode gap Go=40 mm.

In the comparative example B shown in FIG. 39B, the upper electrode 38 is provided with a dielectric film 90 having the same film thickness profile as that of the present example A, but the dielectric film 90 protrudes in the opposite direction (i.e., the taper 90a is formed toward the backside). In the present example C shown in FIG. 39C, the upper electrode 38 is provided with no dielectric film 90. In either of FIGS. 39B and 39C, the inter-electrode gap is constant at Go=40 mm in the radial direction.

Figure 40:
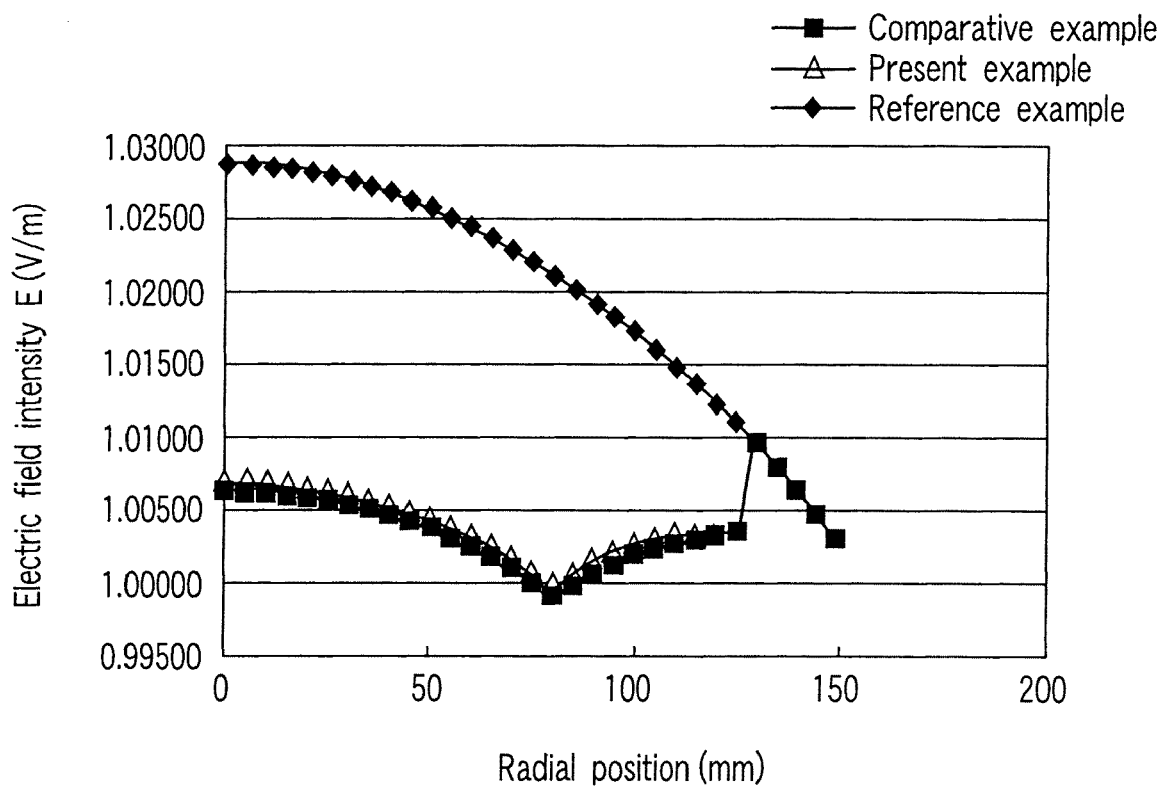
FIG. 40 is a view showing distribution characteristics of electric field intensity in the radial direction between electrodes, obtained by the present example, comparative example, and reference example shown in FIGS. 39A to 39C.

FIG. 40 is a view showing distribution characteristics of electric field intensity in the radial direction between electrodes, obtained by the present example A, comparative example B, and reference example C shown in FIGS. 39A to 39C. As shown in FIG. 40, according to the present example A, the protrusion of the dielectric film 90 allows the distribution characteristic of electric field intensity to be controlled or adjusted such that the electric field intensity E becomes higher at respective positions in the radial direction, as compared with the comparative example B with no protrusion. This adjustment of the electric field intensity distribution by the protrusion can be controlled by the protruding amount k, which is preferably set at k=5 mm or more.

Figure 41:
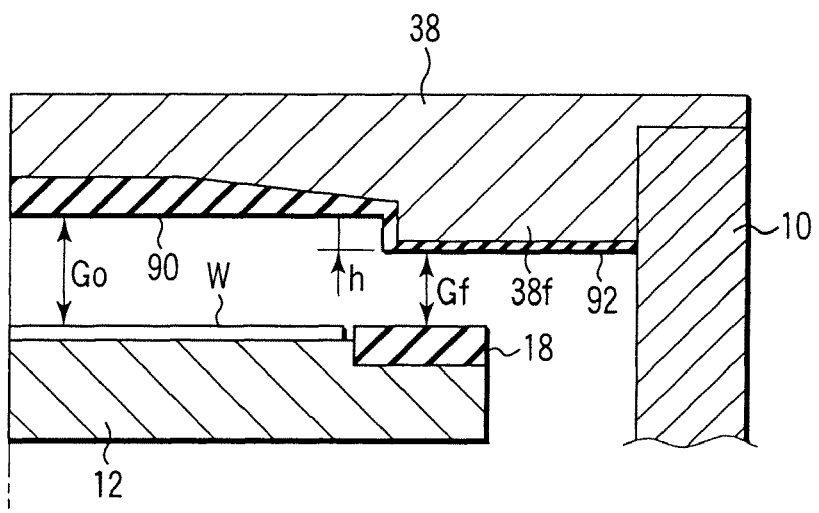
FIG. 41 is a partial and sectional view showing an upper electrode structure according to a modification of the embodiment shown in FIGS. 35A to 38.

FIG. 41 is a partial and sectional view showing an upper electrode structure according to a modification of the embodiment shown in FIGS. 35A to 38. As shown in FIG. 41, a protrusion 38f is formed on the main surface of the upper electrode 38 radially outside the dielectric film 90. In this respect, the edge portion of the dielectric film 90 may be continuous to the outer electrode protrusion 38f, or the edge portion of the dielectric film 90 may protrude along with the outer electrode protrusion 38f.

FIGS. 42A to 42D are partial and sectional views showing upper electrode structures according to another embodiment of the present invention. As shown in FIGS. 42A to 42D, according to this embodiment, a dielectric film 90 having a void 104 therein is disposed on the main surface of the upper electrode 38, and formed of a hollow dielectric body, such as a hollow ceramic. Also in this embodiment, the hollow dielectric body 90 preferably has a profile set such that the thickness is larger at the central portion than at the edge portion in the radial direction.

The void 104 of the hollow dielectric body 90 contains a required amount of a dielectric fluid NZ. The dielectric fluid NZ within the void 104 counts as part of the dielectric body 90, depending on its occupation volume. The dielectric fluid NZ is typically preferably formed of an organic solvent (e.g., Galden), although it may be a powder.

Figure 42A:
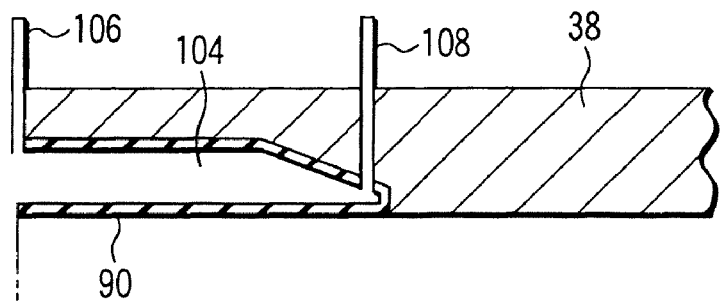
FIGS. 42A to 42D are partial and sectional views showing upper electrode structures according to another embodiment of the present invention.
Figure 42B:
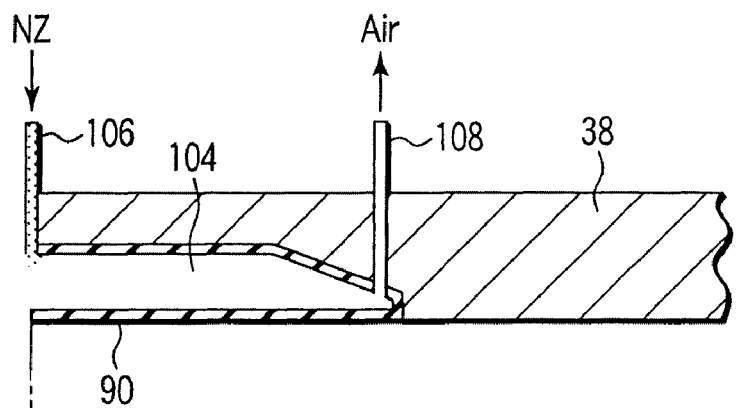
Figure 42C:
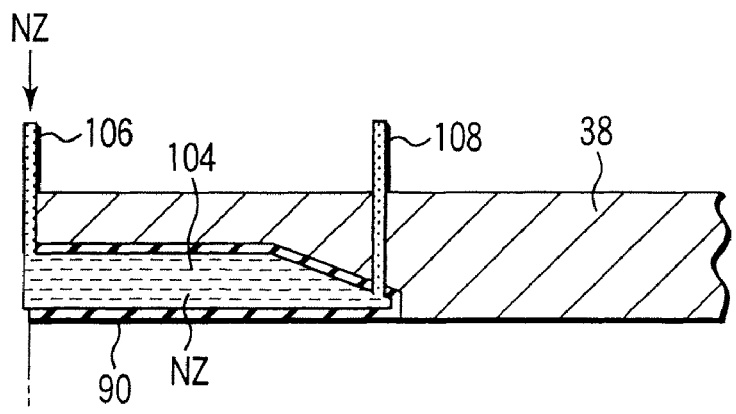
Figure 42D:
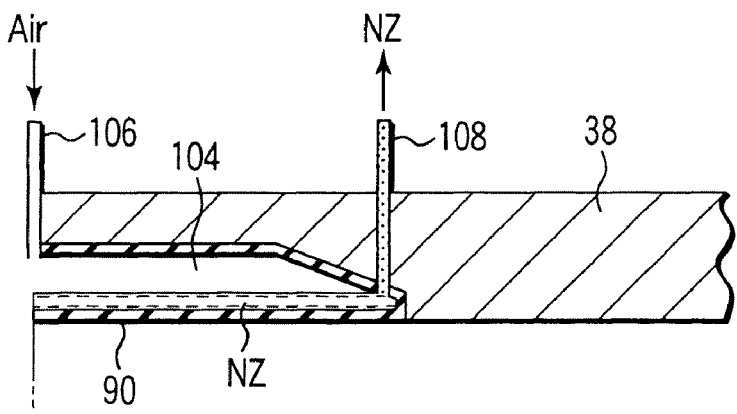

The void 104 may be connected at different positions (e.g., at the central portion and edge portion) to, e.g., pipes 106 and 108 extending from the backside of the electrode 38, which are used as inlet and outlet ports for the dielectric fluid NZ. As shown in FIG. 42B, when the dielectric fluid NZ is supplied into the void 104 of the hollow dielectric body 90, the dielectric fluid NZ is fed through the pipe 106 while air is released from the void 104 through the other pipe 108. As shown in FIG. 42D, when the dielectric fluid NZ within the void 104 is reduced, air is fed through the pipe 106 while the dielectric fluid NZ is released from the void 104 through the other pipe 108.

Figure 43:
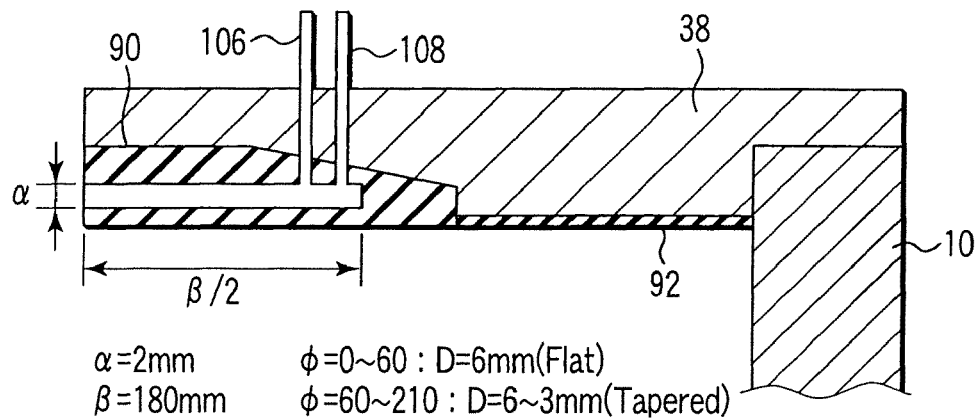
FIG. 43 is a partial and sectional view showing a specific present example of the embodiment shown in FIGS. 42A to 42D.

FIG. 43 is a partial and sectional view showing a specific present example of the embodiment shown in FIGS. 42A to 42D. In this present example, the hollow dielectric film 90 is a disc with a diameter of 210 mm, and has a thickness profile set such that D=6 mm (flat) within φ=0 to 60 mm, and D=6 to 3 mm (tapered) within φ=60 to 210 mm. The void 104 of the hollow dielectric body 90 has a thickness α of 2 mm, and a diameter β of 180 mm.

Figure 44:
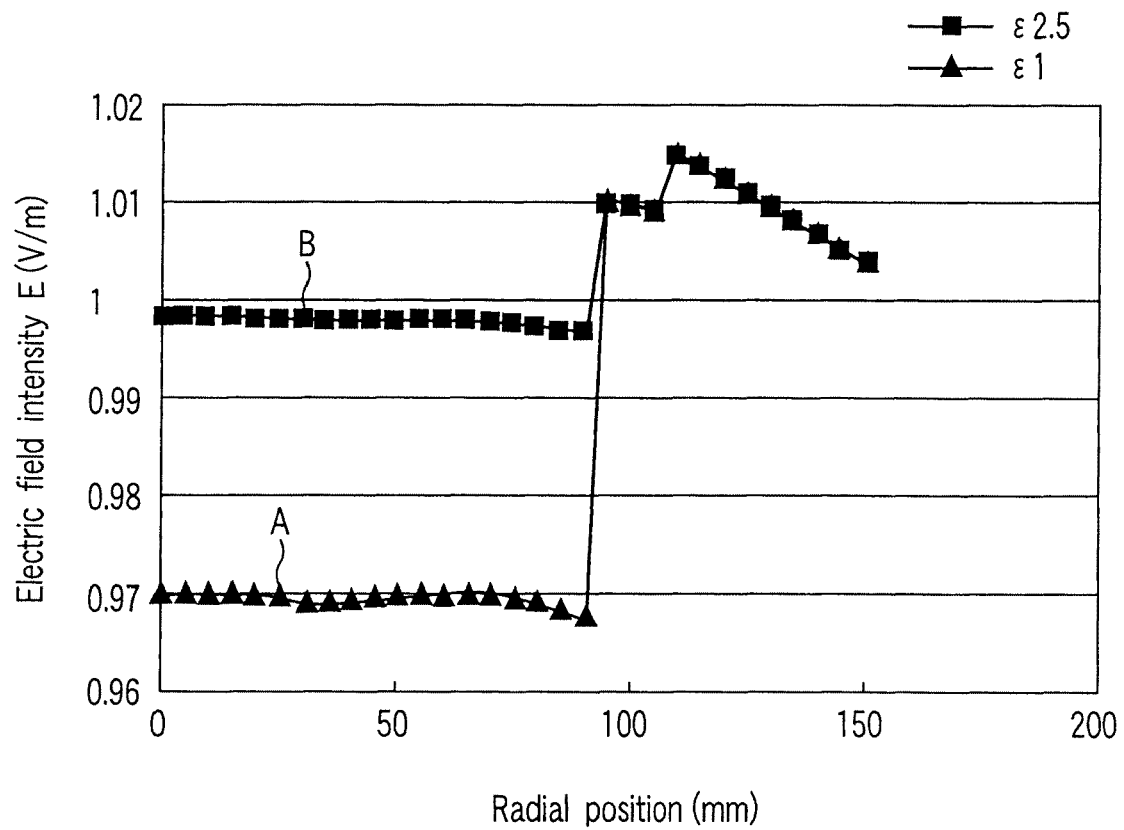
FIG. 44 is a view showing distribution characteristics of electric field intensity in the radial direction between electrodes, obtained by the present example shown in FIG. 43.

FIG. 44 is a view showing distribution characteristics of electric field intensity in the radial direction between electrodes, obtained by the present example shown in FIG. 43. In FIG. 44, a distribution characteristic A with $\in$=1 is obtained by the state shown in FIG. 42A or a state where the void 104 of the hollow dielectric body 90 is completely empty and filled with air. A distribution characteristic B with $\in$=2.5 is obtained by the state shown in FIG. 42C or a state where the void 104 of the hollow dielectric body 90 is completely filled with Galden. An arbitrary characteristic can be obtained between the characteristics A and B by adjusting the amount of Galden contained in the void 104.

As described above, according to this embodiment, the dielectric constant or dielectric impedance of the entire dielectric body 90 can be adjusted or controlled by changing the type and amount of the dielectric fluid NZ contained in the void 104 of the hollow dielectric body 90.

FIGS. 45A to 45D are partial and sectional views showing upper electrode structures according to a modification of the embodiment shown in FIGS. 42A to 42D.

Figure 45A:
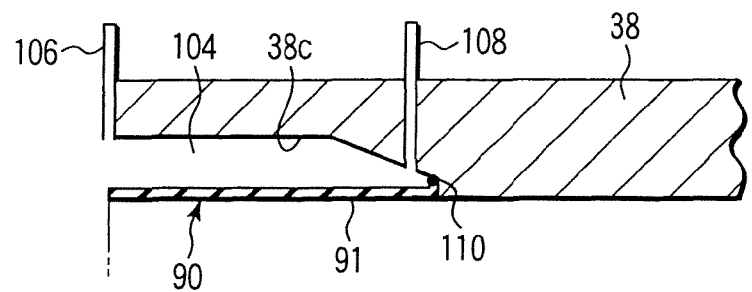
FIGS. 45A to 45D are partial and sectional views showing upper electrode structures according to a modification of the embodiment shown in FIGS. 42A to 42D.

In the modification shown in FIG. 45A, the front surface of a dielectric body 90 is formed of a ceramic plate 91, and the inner wall of the void 104 facing the ceramic plate 91 is made of the host material (aluminum) of the upper electrode 38. In other words, a recess 38c is formed in the main surface of the upper electrode 38 in accordance with the shape of the dielectric body 90, and the recess 38c is covered with the ceramic plate 91. A seal member 110, such as an O-ring, is preferably disposed to seal the periphery of the ceramic plate 91. In this case, the shape of the recess 38c or void 104 is important, and the thickness is preferably set larger at the central portion than at the edge portion.

Figure 45B:
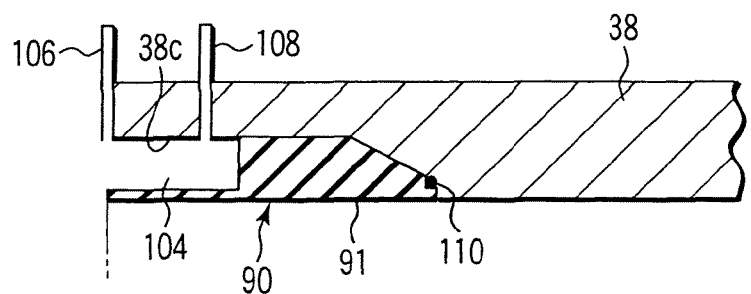
Figure 45C:
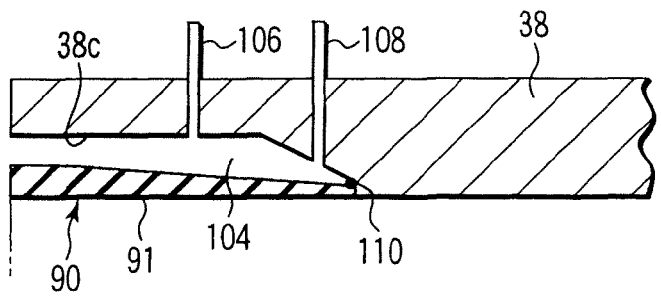

In the modification shown in FIGS. 45B and 45C, a specific region for containing the dielectric fluid NZ is limited or localized within the space or void 104 of the hollow dielectric body 90. For example, as shown in FIG. 45B, this space of the void 104 is localized on the central side of the dielectric body 90. Alternatively, as shown in FIG. 45C, the thickness of the ceramic plate 91 is changed in the radial direction (or gradually reduced from the central portion to the edge portion), so that the space of the void 104 described above is localized relatively on the peripheral side. The function of adjusting the dielectric constant by the dielectric fluid NZ can be varied by adjusting the position or shape of the space of the void 104 within the hollow dielectric body 90, as required.

Figure 45D:
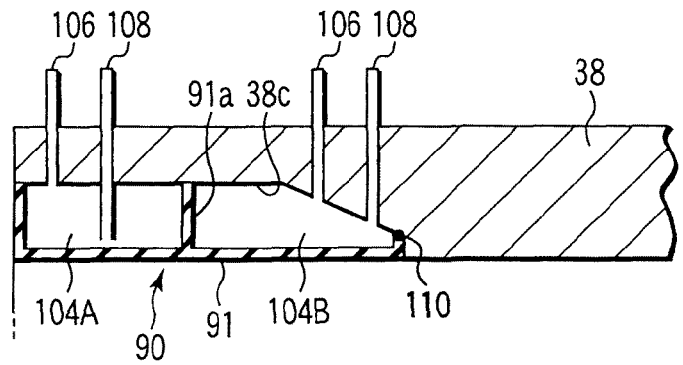

In the modification shown in FIG. 45D, the void 104 of the hollow dielectric body 90 is divided into a plurality of spaces, which are controlled independently of each other in terms of the inflow, outflow, and filling amount of the dielectric fluid NZ. For example, as shown in FIG. 45D, an annular partition 91a integrally formed with the ceramic plate 91 is used to divide the void 104 into a space 104A on the central side and a space 104B on the peripheral side.

The present invention has been described with reference to preferable embodiments independently of each other, but electrode structures according to different embodiments may also be combined with each other. For example, an electrode structure according to the third embodiment or an embodiment thereafter may be combined with an electrode structure having protrusions 70 according to the first embodiment, or with an electrode structure having recesses 80 according to the second embodiment.

For example, it may be arranged such that an electrode structure according to the third embodiment or an embodiment thereafter is applied to the susceptor 12, as shown in FIG. 19, while an electrode structure according to the first embodiment (see FIGS. 2 and 3) is applied to the upper electrode 38, or while an electrode structure according to the second embodiment (see FIGS. 15 and 16) is applied to the upper electrode 38. Alternatively, it may be arranged such that an electrode structure according to the third embodiment or an embodiment thereafter is applied to the upper electrode 38, as shown in FIG. 20, while an electrode structure according to the first embodiment (see FIGS. 2 and 3) is applied to the susceptor 12, or while an electrode structure according to the second embodiment (see FIGS. 15 and 16) is applied to the susceptor 12.

As a matter of course, an electrode structure according to the first, second, or third embodiment, or an embodiment thereafter may be applied to both of the upper and lower electrodes. Alternatively, an electrode structure according to the first, second, or third embodiment, or an embodiment thereafter may be applied to only one of the upper and lower electrodes, while a conventional electrode structure is applied to the other electrode.

The plasma etching apparatus (FIG. 1) according to the embodiments is of the type in which an RF power for plasma generation is applied to the susceptor 12. Alternatively, although not shown, the present invention may be applied to the type in which an RF power for plasma generation is applied to the upper electrode 38. Further, the present invention may be applied to the type in which first and second RF powers with different frequencies are respectively applied to the upper electrode 38 and susceptor 12 (the type applying RF powers to the upper and lower sides). Alternatively, the present invention may be applied to the type in which first and second RF powers with different frequencies are superposed and applied to the susceptor 12 (the type applying two superposed frequencies to the lower side).

In a broad sense, the present invention is applicable to a plasma processing apparatus which has at least one electrode disposed within a process container configured to reduce the pressure therein. Further, the present invention is applicable to a plasma processing apparatus for another process, such as plasma CVD, plasma oxidation, plasma nitridation, or sputtering. Furthermore, in the present invention, the target substrate is not limited to a semiconductor wafer, and it may be one of various substrates for flat panel displays, or a photomask, CD substrate, or printed circuit board.

With a plasma processing apparatus or an electrode plate for a plasma processing apparatus according to the present invention, the uniformity of plasma density is efficiently improved by the structures and effects described above.

Further, with a method of manufacturing an electrode plate according to the present invention, a structure can be efficiently fabricated in which an electrostatic chuck is integrally formed with an electrode plate for a plasma processing apparatus according to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus for performing a plasma process on a target substrate essentially having a circular contour, the apparatus comprising:

a process container configured to accommodate the target substrate and to reduce pressure therein;

a first electrode and a second electrode disposed opposite each other within the process container, the first electrode being an upper electrode, and the second electrode being a lower electrode on which the target substrate is placed;

a gas supply system configured to supply a process gas into the process container;

a radio frequency (RF) power supply connected to the first electrode or the second electrode and configured to apply an RF power thereto for generating plasma of the process gas between the first and second electrodes;

a circular dielectric portion embedded in the first electrode and defining a central part of a lower surface of the first electrode that is exposed to plasma during the plasma process, the dielectric portion being concentric with the first electrode and having a thickness larger at an electrode central portion than at an electrode edge portion; and a plurality of detachable conductive shield rings with variable widths so that when one of said conductive shield rings is disposed on the lower surface of the first electrode to be concentric with the dielectric portion, said one conductive shield ring covers the electrode and a periphery of the dielectric portion leaving a controlled opening with a required diameter to expose a central portion of the dielectric portion while covering a peripheral portion of the dielectric portion, the diameter of the opening being used as a parameter for adjusting a distribution characteristic of electric field intensity between the first and second electrodes.

2. The apparatus according to claim 1, wherein the shield ring is detachably attached to the first electrode.

3. The apparatus according to claim 1, wherein a surface of the shield ring to be exposed to the plasma is covered with a protection layer.

4. The apparatus according to claim 3, wherein the protection layer comprises an alumite-processed surface, or a thermal-sprayed film of a material selected from the group consisting of $Al_2O_3$ and $Y_2O_3$.

5. The apparatus according to claim 1, wherein the dielectric portion includes a tapered portion disposed at the peripheral portion and having a thickness that decreases taper-wise toward the electrode edge portion, and the shield ring covers all or part of the tapered portion.

6. The apparatus according to claim 5, wherein the diameter of the opening is preset such that a contour of the opening is present on the tapered portion.

7. The apparatus according to claim 6, wherein the tapered portion is directly connected to the flat portion in the dielectric portion.

8. The apparatus according to claim 6, wherein the gas supply system is configured to supply as the process gas a gas for etching the target substrate.

9. The apparatus according to claim 6, wherein the RF power supply is connected to the second electrode and configured to apply an RF power having a frequency of 50 MHz or more.

10. The apparatus according to claim 1, wherein the dielectric portion includes a flat portion disposed at a center to be concentric with the first electrode and having a first diameter and a first constant thickness, and a tapered portion disposed outside the first diameter to be concentric with the flat portion and having a thickness that decreases taper-wise toward the electrode edge portion.

11. The apparatus according to claim 10, wherein the diameter of the opening is preset such that a contour of the opening is present on the tapered portion.

12. A plasma processing apparatus for performing a plasma process on a target substrate essentially having a circular contour, the apparatus comprising:

a process container configured to accommodate the target substrate and to reduce pressure therein;

a first electrode and a second electrode disposed opposite each other within the process container, the first electrode being an upper electrode, and the second electrode being a lower electrode on which the target substrate is placed;

a gas supply system configured to supply a process gas into the process container; a radio frequency (RF) power supply connected to the first electrode or the second electrode and configured to apply an RF power thereto for generating plasma of the process gas between the first and second electrodes;

a circular dielectric portion embedded in the first electrode and defining a central part of a lower surface of the first electrode that is exposed to plasma during the plasma process, the dielectric portion being concentric with the first electrode and having a thickness larger at an electrode central portion than at an electrode edge portion, the dielectric portion including a tapered portion disposed at a peripheral portion and having a thickness that decreases taper-wise toward the electrode edge portion;

a plurality of detachable conductive shield rings with variable widths so that when one of said conductive shield rings is disposed on the lower surface of the first electrode to be concentric with the dielectric portion, said one conductive shield ring covers the electrode and a periphery of the dielectric portion leaving a controlled opening with a required diameter to expose a central portion of the dielectric portion while covering all or part of the tapered portion, the shield ring being detachably attached to the first electrode; and a protection layer covering a surface of the shield ring to be exposed to the plasma.

13. The apparatus according to claim 12, wherein the protection layer comprises an alumite-processed surface, or a thermal-sprayed film of a material selected from the group consisting of $Al_2O_3$ and $Y_2O_3$.

14. The apparatus according to claim 12, wherein the diameter of the opening is preset such that a contour of the opening is present on the tapered portion.

15. The apparatus according to claim 12, wherein the dielectric portion further includes a flat portion disposed at a center to be concentric with the first electrode and having a first diameter and a first constant thickness, and the tapered portion is disposed outside the first diameter to be concentric with the flat portion.

16. The apparatus according to claim 15, wherein the tapered portion is directly connected to the flat portion in the dielectric portion.

17. The apparatus according to claim 12, wherein the gas supply system is configured to supply as the process gas a gas for etching the target substrate.

18. The apparatus according to claim 12, wherein the RF power supply is connected to the second electrode and configured to apply an RF power having a frequency of 50 MHz or more.

* * * * *